(12) United States Patent
Ohsawa et al.

(10) Patent No.: US 9,112,170 B2
(45) Date of Patent: Aug. 18, 2015

(54) LIGHT-EMITTING ELEMENT, LIGHT-EMITTING DEVICE, AND ELECTRONIC DEVICE

(75) Inventors: Nobuharu Ohsawa, Zama (JP); Satoshi Seo, Kawasaki (JP); Hiroko Murata, Odawara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 677 days.

(21) Appl. No.: 11/713,622

(22) Filed: Mar. 5, 2007

(65) Prior Publication Data
US 2007/0222376 A1 Sep. 27, 2007

(30) Foreign Application Priority Data
Mar. 21, 2006 (JP) ................................. 2006-077896

(51) Int. Cl.
*H01L 51/54* (2006.01)
*H01L 51/50* (2006.01)

(52) U.S. Cl.
CPC ................................. *H01L 51/5016* (2013.01)

(58) Field of Classification Search
USPC ........................................................ 428/690
See application file for complete search history.

(56) References Cited

U.S. PATENT DOCUMENTS

| 4,629,671 | A | 12/1986 | Everhardus et al. |
| 4,806,496 | A | 2/1989 | Suzuki et al. |
| 5,420,288 | A | 5/1995 | Ohta et al. |
| 5,610,309 | A | 3/1997 | Ohta et al. |
| 5,747,183 | A | 5/1998 | Shi et al. |
| 5,989,737 | A | 11/1999 | Xie et al. |
| 6,013,384 | A | 1/2000 | Kido et al. |
| 6,285,039 | B1 | 9/2001 | Kobori et al. |
| 6,329,084 | B1 | 12/2001 | Tamano et al. |
| 6,361,886 | B2 | 3/2002 | Shi et al. |

(Continued)

FOREIGN PATENT DOCUMENTS

| CN | 1365347 | 8/2002 |
| CN | 1854136 | 11/2006 |

(Continued)

OTHER PUBLICATIONS

Guan, M.; Bian, Z. Q.; Zhou, Y. F.; Li, F. Y.; Li, Z. J.; Huang, C. H. Chem. Commun. 2003, 2708-2709.*

(Continued)

*Primary Examiner* — J. L. Yang
(74) *Attorney, Agent, or Firm* — Eric J. Robinson; Robinson Intellectual Property Law Office, P.C.

(57) ABSTRACT

It is an object to provide an element structure which is suitable for a light-emitting element using a phosphorescent compound. It is another object to provide a light-emitting element with high luminous efficiency by using the element structure. In particular, it is another object to provide a light-emitting element with high luminous efficiency and long life. A light-emitting element is manufactured, which includes a first light-emitting layer and a second light-emitting layer provided to be in contact with each other between a first electrode and a second electrode, where the first light-emitting layer includes a hole transporting host material and a phosphorescent compound, and the second light-emitting layer includes an electron transporting host material and the phosphorescent compound.

16 Claims, 17 Drawing Sheets

(56) References Cited

U.S. PATENT DOCUMENTS

| | | | |
|---|---|---|---|
| 6,406,804 B1 | 6/2002 | Higashi et al. | |
| 6,423,429 B2 | 7/2002 | Kido et al. | |
| 6,465,115 B2 | 10/2002 | Shi et al. | |
| 6,486,601 B1 | 11/2002 | Sakai et al. | |
| 6,528,657 B2 | 3/2003 | Nakaya et al. | |
| 6,566,594 B2 | 5/2003 | Sano et al. | |
| 6,589,673 B1 | 7/2003 | Kido et al. | |
| 6,593,013 B2 | 7/2003 | Nii et al. | |
| 6,734,457 B2 | 5/2004 | Yamazaki et al. | |
| 6,773,831 B2 | 8/2004 | Higashi et al. | |
| 6,784,318 B2 | 8/2004 | Shirota et al. | |
| 6,797,848 B2 | 9/2004 | Hosokawa et al. | |
| 6,864,628 B2 | 3/2005 | Yamazaki et al. | |
| 6,867,538 B2 * | 3/2005 | Adachi et al. ............... | 313/503 |
| 6,936,961 B2 | 8/2005 | Liao et al. | |
| 7,038,086 B2 | 5/2006 | Shirota et al. | |
| 7,042,151 B2 | 5/2006 | Yamazaki et al. | |
| 7,158,161 B2 | 1/2007 | Gyoutoku et al. | |
| 7,345,300 B2 | 3/2008 | Qin et al. | |
| 7,608,993 B2 | 10/2009 | Matsuura et al. | |
| 7,646,010 B2 | 1/2010 | Kawakami et al. | |
| 7,732,808 B2 | 6/2010 | Ikeda et al. | |
| 7,893,427 B2 | 2/2011 | Kumaki et al. | |
| 7,906,226 B2 | 3/2011 | Matsuura et al. | |
| 2002/0048687 A1 * | 4/2002 | Hosokawa et al. ........... | 428/690 |
| 2002/0093005 A1 | 7/2002 | Sohn et al. | |
| 2002/0105005 A1 | 8/2002 | Seo et al. | |
| 2002/0180349 A1 | 12/2002 | Aziz et al. | |
| 2003/0189401 A1 | 10/2003 | Kido et al. | |
| 2003/0205696 A1 | 11/2003 | Thoms et al. | |
| 2004/0124425 A1 | 7/2004 | Yamazaki et al. | |
| 2004/0227460 A1 | 11/2004 | Liao et al. | |
| 2004/0234814 A1 | 11/2004 | Nakaya et al. | |
| 2005/0031899 A1 | 2/2005 | Nomura et al. | |
| 2005/0074630 A1 | 4/2005 | Kanno et al. | |
| 2005/0084712 A1 | 4/2005 | Kido et al. | |
| 2005/0084713 A1 | 4/2005 | Kido et al. | |
| 2005/0084994 A1 * | 4/2005 | Yamazaki et al. ............ | 438/29 |
| 2005/0098207 A1 | 5/2005 | Matsumoto et al. | |
| 2005/0106419 A1 | 5/2005 | Endoh et al. | |
| 2005/0127826 A1 | 6/2005 | Qiu et al. | |
| 2005/0170208 A1 | 8/2005 | Yatsunami et al. | |
| 2005/0208327 A1 * | 9/2005 | Begley et al. ................. | 428/690 |
| 2005/0218396 A1 | 10/2005 | Tsuchiya et al. | |
| 2006/0008740 A1 | 1/2006 | Kido et al. | |
| 2006/0134456 A1 | 6/2006 | Ikeda et al. | |
| 2006/0180812 A1 * | 8/2006 | Sakata et al. .................. | 257/40 |
| 2006/0181206 A1 | 8/2006 | Yamazaki et al. | |
| 2006/0243970 A1 | 11/2006 | Seo et al. | |
| 2006/0292394 A1 | 12/2006 | Iwaki et al. | |
| 2007/0007516 A1 | 1/2007 | Seo et al. | |
| 2007/0049778 A1 | 3/2007 | Nomura et al. | |
| 2007/0059553 A1 | 3/2007 | Egawa et al. | |
| 2007/0069197 A1 | 3/2007 | Leclerc | |
| 2007/0075632 A1 | 4/2007 | Kawakami et al. | |
| 2007/0085106 A1 | 4/2007 | Kawakami et al. | |
| 2007/0149784 A1 * | 6/2007 | Murata et al. ................. | 548/143 |
| 2007/0182317 A1 | 8/2007 | Kido et al. | |
| 2007/0200125 A1 | 8/2007 | Ikeda et al. | |
| 2008/0006822 A1 * | 1/2008 | Ohsawa ......................... | 257/40 |
| 2008/0149923 A1 | 6/2008 | Ohsawa et al. | |
| 2008/0203406 A1 | 8/2008 | He et al. | |
| 2008/0230747 A1 | 9/2008 | Nomura et al. | |
| 2009/0026922 A1 | 1/2009 | Iwaki et al. | |
| 2009/0230847 A1 | 9/2009 | Iwaki et al. | |
| 2010/0096627 A1 | 4/2010 | Ikeda et al. | |
| 2010/0207518 A1 | 8/2010 | Ikeda et al. | |
| 2011/0121277 A1 | 5/2011 | Matsuura et al. | |

FOREIGN PATENT DOCUMENTS

| | | | |
|---|---|---|---|
| CN | 1919842 | 2/2007 | |
| EP | 1009044 A | 6/2000 | |
| EP | 1182183 A | 2/2002 | |
| EP | 1351558 A | 10/2003 | |
| EP | 1478025 A | 11/2004 | |
| EP | 1524706 A | 4/2005 | |
| EP | 1617493 A | 1/2006 | |
| EP | 1351558 B | 7/2006 | |
| EP | 1718122 A | 11/2006 | |
| EP | 1923930 A | 5/2008 | |
| EP | 2270897 A | 1/2011 | |
| JP | 57-068839 A | 4/1982 | |
| JP | 62-200359 A | 9/1987 | |
| JP | 62-201454 A | 9/1987 | |
| JP | 63-165855 A | 7/1988 | |
| JP | 01-185527 A | 7/1989 | |
| JP | 01-208873 A | 8/1989 | |
| JP | 02-272570 A | 11/1990 | |
| JP | 02-288092 A | 11/1990 | |
| JP | 03-274695 A | 12/1991 | |
| JP | 06-258852 A | 9/1994 | |
| JP | 08-245954 A | 9/1996 | |
| JP | 08-311051 A | 11/1996 | |
| JP | 09-063771 A | 3/1997 | |
| JP | 09-288364 A | 11/1997 | |
| JP | 10-161329 A | 6/1998 | |
| JP | 11-204262 A | 7/1999 | |
| JP | 11-307259 A | 11/1999 | |
| JP | 11-307264 A | 11/1999 | |
| JP | 2000-182776 A | 6/2000 | |
| JP | 2001-319779 A | 11/2001 | |
| JP | 2002-289356 A | 10/2002 | |
| JP | 2002-352957 A | 12/2002 | |
| JP | 2003-007467 A | 1/2003 | |
| JP | 2003-020477 A | 1/2003 | |
| JP | 2003-086381 A | 3/2003 | |
| JP | 2003-229275 | 8/2003 | |
| JP | 2003-272860 A | 9/2003 | |
| JP | 2003-347059 A | 12/2003 | |
| JP | 2004-014440 A | 1/2004 | |
| JP | 2004-071500 A | 3/2004 | |
| JP | 2004-522264 | 7/2004 | |
| JP | 2004-220931 A | 8/2004 | |
| JP | 2004-234952 A | 8/2004 | |
| JP | 2004-295012 A | 10/2004 | |
| JP | 2004-303636 A | 10/2004 | |
| JP | 2004-311420 | 11/2004 | |
| JP | 2004-342614 A | 12/2004 | |
| JP | 2005-026121 A | 1/2005 | |
| JP | 2005-032618 A | 2/2005 | |
| JP | 2005-123095 A | 5/2005 | |
| JP | 2005-179488 A | 7/2005 | |
| JP | 2005-251587 A | 9/2005 | |
| JP | 2005-527090 | 9/2005 | |
| JP | 2006-024791 A | 1/2006 | |
| JP | 2008-509565 | 3/2008 | |
| KR | 2003-0080056 A | 10/2003 | |
| WO | WO-02-071813 | 9/2002 | |
| WO | WO-02/071813 | 9/2002 | |
| WO | WO-2005/079118 | 8/2005 | |
| WO | WO-2006/015567 | 2/2006 | |
| WO | WO 2006/033472 A1 * | 3/2006 | ............ H05B 33/24 |
| WO | WO-2006/072470 | 7/2006 | |
| WO | WO-2007/029426 | 3/2007 | |

OTHER PUBLICATIONS

Guan, M.; Bian, Z-Q.; Zhou, Y-F.; Li, F-Y.; Li, Z-J.; Huang, C-H. Chem. Commun., 2003, 2708-2709.*

T. Tsutsui et al., *High Quantum Efficiency in Organic Light-Emitting Devices with Iridium-Complex as a Triplet Emissive Center*, Jpn. J. Appl. Phys., vol. 38, Part 2, No. 12B, Dec. 15, 1999, pp. L1502-L1504.

Baldo.M et al., "Very High-Efficiency Green Organic Light-Emitting Devices Based on Electrophosphorescence,", Appl. Phys. Lett. (Applied Physics Letters), Jul. 5, 1999, vol. 75, No. 1, pp. 4-6.

Leung.M et al., "The Unusual Electrochemical and Photophysical Behavior of 2,2'-Bis(1,3,4-Oxadiazol-2-YL)Biphenyls,Effective Electron Transport Hosts for Phosphorescent Organic Light Emitting Diodes,", Organic Letters, 2007, vol. 9, No. 2, pp. 235-238.

(56) References Cited

OTHER PUBLICATIONS

Kawano.T et al., "Copper-Mediated Direct Arylation of 1,3,4-Oxadiazoles and 1,2,4-Triazoles with Aryl Iodides,", Organic Letters, May 21, 2009, vol. 11, No. 14, pp. 3072-3075.
Tokito.S et al., "Metal Oxides as a Hole-Injecting Layer for an Organic Electroluminescent Device,", J. Phys. D: Appl. Phys. (Journal of Physics D: Applied Physics), 1996, vol. 29, No. 11, pp. 2750-2753.
Tao.S et al., "Anthracene Derivative For a Non-Doped Blue-Emitting Organic Electroluminescence Device With Both Excellent Color Purity and High Efficiency,", Chem. Phys. Lett. (Chemical Physics Letters), 2004, vol. 397, pp. 1-4.
Chinese Office Action (Application No. 201010537591.8) Dated Aug. 3, 2012.
Thomas.K et al., "Green and Yellow Electroluminescent Dipolar Carbazole Derivatives: Features and Benefits of Electron-Withdrawing Segments", Chem. Mater. (Chemistry of Materials), 2002, vol. 14, No. 9, pp. 3852-3859.
Thomas.K et al., "New Carbazole-Oxadiazole Dyads for Electroluminescent Devices: Influence of Acceptor Substituents on Luminescent and Thermal Properties", Chem. Mater. (Chemisty of Materials), 2004, vol. 16, No. 25, pp. 5437-5444.
Brunner.K et al., "Carbazole Compounds as Host Materials for Triplet Emitters in Organic Light-Emitting Diodes: Tuning the HOMO Level without Influencing the Triplet Energy in Small Molecules", J. Am. Chem. Soc.(Journal of the American Chemical Society), Apr. 23, 2014, vol. 126, No. 19, pp. 6035-6042.
"STN Structure Search Results", Apr. 20, 2010.
Korean Office Action (Application No. 2013-0128767) Dated Jul. 29, 2014.

* cited by examiner

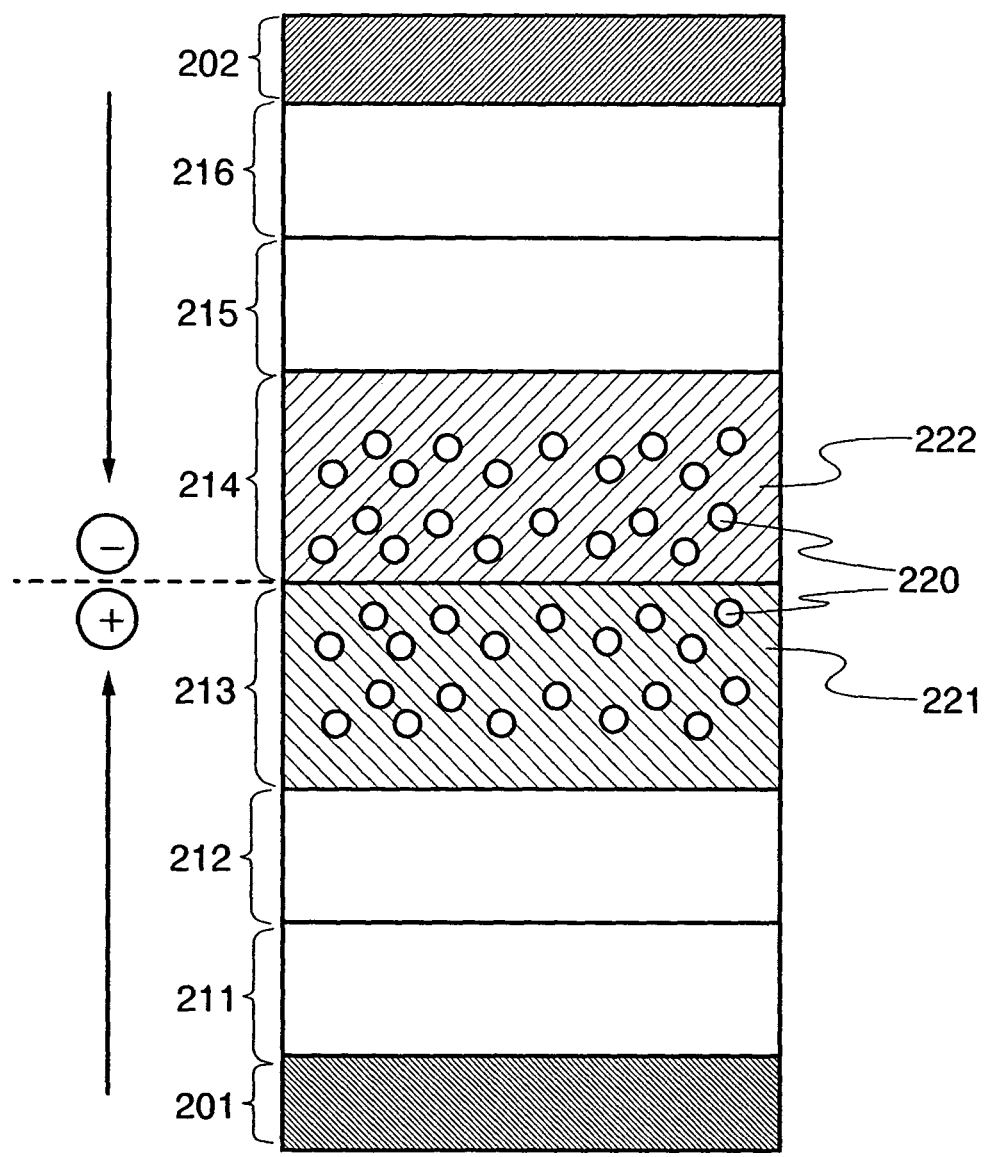

LIGHT-EMITTING ELEMENT, LIGHT-EMITTING DEVICE, AND ELECTRONIC DEVICE

BACKGROUND OF THE INVENTION

1. Field of the Invention

The present invention relates to a light-emitting element using a phosphorescent compound. Further, the present invention relates to a light-emitting device using the light-emitting element. Furthermore, the present invention relates to an electronic device using the light-emitting device.

2. Description of the Related Art

In recent years, a light-emitting element using a light-emitting organic compound or inorganic compound as a light-emitting substance has been actively developed. In particular, a light-emitting element called an EL element has a simple structure in which a light-emitting layer containing a light-emitting substance is provided between electrodes. Therefore, the light-emitting element has attracted attention as a next-generation flat panel display element because of its characteristics such as a thin shape, lightweight, high response speed, and direct current driving at low voltage. In addition, a display using such a light-emitting element has a feature that it is excellent in contrast and image quality, and has a wide viewing angle. Further, since these light-emitting elements are plane light sources, it is considered that these light-emitting elements are applied as light sources such as a backlight of a liquid crystal display and lighting.

In a case of using a light-emitting organic compound as a light-emitting substance, the emission mechanism of a light-emitting element is a carrier injection type. Namely, by application of a voltage with a light-emitting layer interposed between electrodes, carriers (holes and electrons) injected from the electrodes are recombined and a light-emitting substance is made to be in an exited state. Light is emitted when the excited state returns to the ground state. As the type of the excited state, a singlet excited state (S*) and a triplet excited state (T*) are possible. The statistical generation ratio thereof in a light-emitting element is considered to be S*:T*=1:3.

In general, the ground state of a light-emitting organic compound is a singlet excited state. Therefore, light emission from a singlet excited state (S*) is referred to as fluorescence because of electron transition between the same multiplicities. On the other hand, light emission from a triplet excited state (T*) is referred to as phosphorescence because of electron transition between different multiplicities. Here, in a compound emitting fluorescence (hereinafter referred to as a fluorescent compound), in general, phosphorescence is not observed at room temperature, and only fluorescence is observed. Therefore, in a light-emitting element using a fluorescent compound, the theoretical limit of internal quantum efficiency (the ratio of generated photons to injected carriers) is considered to be 25% based on S*:T*=1:3.

On the other hand, when a compound emitting phosphorescence (hereinafter referred to as a phosphorescent compound) is used, internal quantum efficiency can be theoretically 75 to 100%. In other words, luminous efficiency can be three to four times as high as that of a fluorescent compound. From these reasons, in order to achieve a light-emitting element with high efficiency, a light-emitting element using a phosphorescent compound has been proposed (for example, see Non Patent Document 1 and Patent Document 1).

In addition, in recent years, by combination of a phosphorescent compound and a light-emitting material different from the phosphorescent compound, an attempt has been made to obtain a white light-emitting element with high efficiency (for example, see Patent Document 2).

[Non Patent Document 1]

Tetsuo TSUTSUI, and eight others, Japanese Journal of Applied Physics, vol. 38, L1502-L1504 (1999)

[Patent Document 1]

Japanese Published Patent Application No.2003-229275

[Patent Document 2]

Japanese Published Patent Application No.2004-311420

SUMMARY OF THE INVENTION

According to the report in Non Patent Document 1 described above, the half-life of luminance is about 170 hours when the initial luminance is set to be 500 cd/m$^2$ in constant current driving, and so, there is a problem on the life of the element. In Non Patent Document 1, it is said that the element has short life since stability of BCP is insufficient, though the BCP is used as a hole blocking layer.

However, if BCP is removed from an element structure in Non Patent Document 1, light emission with favorable efficiency cannot be obtained. The reason is that, if BCP is not provided as a hole blocking layer, holes penetrate to an electron transporting layer since CBP used for a host material of a light-emitting layer in Non Patent Document 1 has a high hole transporting property. Another reason is that BCP has a role to block excitons so that excitation energy (in this case, triplet excitation energy) generated in the light-emitting layer does not escape into the electron transporting layer. Therefore, the hole blocking layer is indispensable in the element structure of Non Patent Document 1, and introduction of a stable hole blocking material as an alternative to BCP has been proposed.

On the other hand, in Patent Document 1, since a light-emitting layer is formed in such a manner that a phosphorescent compound is added to an electron transporting host material, it is not necessary to use BCP. However, contrary to Non Patent Document 1, it is necessary to select a material of a hole transporting layer in a limited way. Therefore, it is indispensable to search a stable hole transporting material used for the hole transporting layer in order to ensure the life of an element.

In view of the foregoing, it is an object of the present invention to provide an element structure which is suitable for a light-emitting element using a phosphorescent compound. It is another object to provide a light-emitting element with high luminous efficiency by using the element structure. In particular, it is another object of the present invention to provide a light-emitting element with high luminous efficiency and long life.

Further, it is another object to provide a light-emitting device with low power consumption and long life by manufacture of a light-emitting device using the above-described light-emitting element. Furthermore, it is another object to provide an electronic device with low power consumption and long life by application of such a light-emitting device to an electronic device.

As a result of diligent study, the present inventors have found out that a light-emitting element by which the object can be solved can be manufactured by application of an element structure to be given below.

That is, an aspect of the present invention is a light-emitting element including a first light-emitting layer and a second light-emitting layer which are provided to be in contact with each other between a first electrode and a second electrode, where the first light-emitting layer contains a hole transporting host material and a phosphorescent compound, and the second light-emitting layer contains an electron transporting host material and the phosphorescent compound.

In the light-emitting element of the present invention, a hole transporting host material is used for the first light-emitting layer, and an electron transporting host material is used for the second light-emitting layer. Therefore, the first light-emitting layer is preferably provided on the anode side. That is, another aspect of the present invention is a light-emitting element including a first light-emitting layer and a second light-emitting layer which are provided to be in contact with each other between a first electrode serving as an anode and a second electrode serving as a cathode, where the first light-emitting layer contains a hole transporting host material and a phosphorescent compound, the second light-emitting layer contains an electron transporting host material and the phosphorescent compound, and the first light-emitting layer is provided closer to the first electrode side than the second light-emitting layer.

In such a light-emitting element, a hole transporting layer containing a hole transporting compound may be further provided so as to be in contact with the first light-emitting layer. At this time, in the element structure of the present invention, high luminous efficiency can be achieved even when triplet excitation energy of the hole transporting compound is lower than triplet excitation energy of the phosphorescent compound. As a result, there is an advantage that various stable and general-purpose (inexpensive) substances can be applied, without limitation by triplet excitation energy in the hole transporting layer. Accordingly, another aspect of the present invention is a light-emitting element, where, in the above-described light-emitting element, a hole transporting layer containing a hole transporting compound is provided between the first electrode and the first light-emitting layer, the hole transporting layer is in contact with the first light-emitting layer, and the hole transporting compound has triplet excitation energy lower than triplet excitation energy of the phosphorescent compound.

The same can be said for a case where an electron transporting layer containing an electron transporting compound is provided to be in contact with the second light-emitting layer. At this time, in the element structure of the present invention, high luminous efficiency can be achieved even when triplet excitation energy of the electron transporting compound is lower than triplet excitation energy of the phosphorescent compound. As a result, there is an advantage that various stable and general-purpose (inexpensive) substances can be applied, without limitation by triplet excitation energy in the electron transporting layer. Accordingly, another aspect of the present invention is a light-emitting element, where, in the above-described light-emitting element, an electron transporting layer containing an electron transporting compound is provided between the second electrode and the second light-emitting layer, the electron transporting layer is in contact with the second light-emitting layer, and the electron transporting compound has triplet excitation energy lower than triplet excitation energy of the phosphorescent compound.

Further, the above-described hole transporting layer and electron transporting layer can also be combined. That is, another aspect of the present invention is a light-emitting element, where a hole transporting layer containing a hole transporting compound is provided between the first electrode and the first light-emitting layer, an electron transporting layer containing an electron transporting compound is provided between the second electrode and the second light-emitting layer, the hole transporting layer is in contact with the first light-emitting layer, the electron transporting layer is in contact with the second light-emitting layer, and the hole transporting compound and the electron transporting compound each have triplet excitation energy lower than triplet excitation energy of the phosphorescent compound.

As the above-described light-emitting element of the present invention, it is preferable to use an aromatic amine compound as the hole transporting host material. As the aromatic amine compound, a triaryl amine compound is particularly preferable as a host material because of its high triplet excitation energy.

As the electron transporting host material, a heteroaromatic compound is preferable. As the heteroaromatic compound, an oxadiazole derivative, an oxazole derivative, an imidazole derivative, a triazole derivative, a triazine derivative, or the like is particularly preferable because of its high triplet excitation energy. As a compound which is specifically preferable, an oxadiazole derivative represented by the following structural formula (1) is given. Since the oxadiazole derivative to be given below is a novel substance, the oxadiazole derivative represented by the following structural formula (1) is also one of the aspects of the present invention.

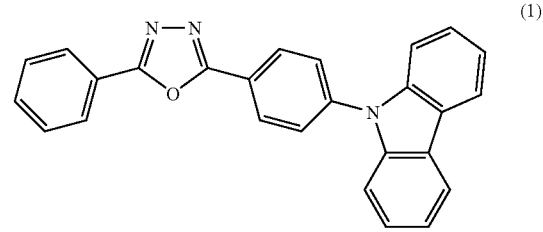 [SMILES: c1ccc(-c2nnc(-c3ccc(-n4c5ccccc5c5ccccc54)cc3)o2)cc1]

(1)

Here, the light-emitting element of the present invention described above has an effective element structure especially in a case where triplet excitation energy of the phosphorescent compound is high. Therefore, another aspect of the present invention is a light-emitting element in which, in the above-described light-emitting element of the present invention, emission color of the phosphorescent compound is blue, bluish green, green, or yellowish green. Further, another aspect of the present invention is a light-emitting element in which an emission wavelength of the phosphorescent compound is greater than or equal to 450 nm and less than or equal to 540 nm.

The light-emitting element of the present invention obtained in such a manner has a feature of high luminous efficiency and long life. Accordingly, low power consumption and long life can be achieved in a light-emitting device (an image display device or a light-emitting device) using the light-emitting element of the present invention. Therefore, the present invention includes a light-emitting device using the light-emitting element of the present invention, and an electronic device including the light-emitting device.

The light-emitting device in this specification includes an image display device or a light-emitting device using the light-emitting element. Further, the following modules are all included in a light-emitting device: a module in which a connector, for example, an anisotropic conductive film, a TAB (tape automated bonding) tape, or a TCP (tape carrier package) is attached to a light-emitting element; a module provided with a printed wiring board at the end of a TAB tape or a TCP; and a module in which an IC (integrated circuit) is directly mounted on a light-emitting element by a COG (chip on glass) method. Further, a light-emitting device used for lighting equipment or the like is also included therein.

By implementation of the present invention, a light-emitting element with high luminous efficiency can be provided. In particular, a light-emitting element with high luminous efficiency and long life can be provided.

Further, by manufacture of a light-emitting device using the light-emitting element described above, a light-emitting device with low power consumption and long life can be provided. Further, by application of such a light-emitting device to an electronic device, an electronic device with low power consumption and long life can be provided.

BRIEF DESCRIPTION OF THE DRAWINGS

In the accompanying drawings:

FIG. 2 is an explanatory view of an element structure of a light-emitting element of the present invention;

DETAILED DESCRIPTION OF THE INVENTION

Hereinafter, Embodiment Modes of the present invention will be explained in detail with reference to the accompanied drawings. However, the present invention is not limited to explanation to be given below, and it is to be easily understood that various changes and modifications in modes and details thereof will be apparent to those skilled in the art without departing from the purpose and the scope of the present invention. Therefore, the present invention should not be interpreted as being limited to the description of the embodiment modes to be given below.

Embodiment Mode 1

In Embodiment Mode 1, a most basic structure of a light-emitting element of the present invention will be explained with reference to FIG. 1.

Figure 1:
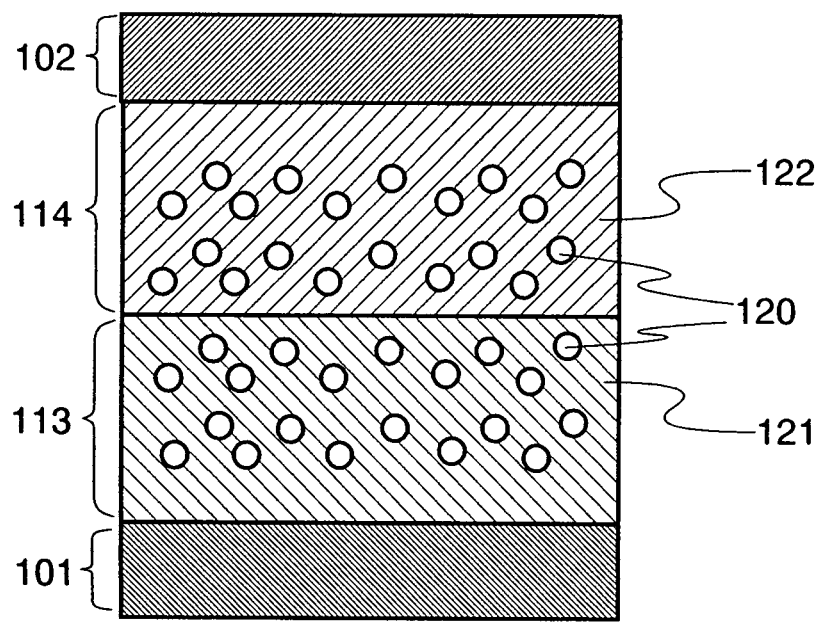
FIG. 1 is an explanatory view of an element structure of a light-emitting element of the present invention.

FIG. 1 shows a light-emitting element of the present invention having a first light-emitting layer 113 and a second light-emitting layer 114 provided to be in contact with each other between a first electrode 101 and a second electrode 102, where the first light-emitting layer 113 includes a hole transporting host material 121 and a phosphorescent compound 120, and the second light-emitting layer 114 includes an electron transporting host material 122 and the phosphorescent compound 120. That is, the phosphorescent compound added to the first light-emitting layer 113 and the phosphorescent compound added to the second light-emitting layer 114 are the same compound. The phosphorescent compound is dispersed in the first light-emitting layer 113 and the second light-emitting layer 114 as a guest material.

With such a structure, independent from a stacking order of the first light-emitting layer 113 and the second light-emitting layer 114, a light-emitting region is formed in the vicinity of an interface between the first light-emitting layer 113 and the second light-emitting layer 114 or formed in both of the first light-emitting layer 113 and the second light-emitting layer 114. That is, a light-emitting region is not easily formed in a region which is largely separated from the vicinity of the interface (for example, in a region in which the first light-emitting layer 113 and the first electrode 101 are in contact with each other in FIG. 1). As a result, it is considered that luminous efficiency and the life of the element can be improved.

In FIG. 1, the first light-emitting layer 113 is provided on the first electrode 101 side and the second light-emitting layer 114 is provided on the second electrode 102 side. However, in reverse order, the second light-emitting layer 114 may be provided on the first electrode 101 side and the first light-emitting layer 113 may be provided on the second electrode 102 side.

The phosphorescent compound 120 may be added to the entire region or part of the first light-emitting layer 113. In the similar manner, the phosphorescent compound 120 may be added to the entire region or part of the second light-emitting layer 114.

Subsequently, a material which can be used for the light-emitting element of the present invention will be specifically exemplified. However, various materials can be used for the light-emitting element of the present invention, without being limited to explanation to be given below.

First, as the phosphorescent compound 120, specifically, an organic metal complex such as bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis[2-(3',5'bistrifluoromethylphenyl)pyridinato-N,C$^{2'}$]iridium(III) picolinate (abbreviation: Ir(CF$_3$ppy)$_2$(pic)), bis[2-(4',6'-difluorophenyl)pyridinato-N,C$^{2'}$]iridium(III)acetylacetonate (abbreviation: FIr(acac)), tris(2-phenylpyridinato-N,C$^{2'}$)iridium(III) (abbreviation: Ir(ppy)$_3$), bis(2-phenylpyridinato-N,C$^{2'}$)iridium(III)acetylacetonate (abbreviation: Ir(ppy)$_2$(acac)), bis(1,2-diphenyl-1H-benzimidazolato)iridium(III) acetylacetonate (abbreviation: Ir(pbi)$_2$(acac)), bis(benzo[h]quinolinato)iridium(III)acetylacetonate (abbreviation: Ir(bzq)$_2$(acac)), bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), tris(2-phenylquinolinato-N,C$^{2'}$)

iridium(III) (abbreviation: Ir(pq)$_3$), bis(2-phenylquinolinato-N,C$^{2'}$)iridium(III)acetylacetonate (abbreviation: Ir(pq)$_2$(acac)), bis[2-(2'-benzo[4,5-α]thienyl)pyridinato-N,C$^{3'}$)iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), or 2,3,7,8,12,13,17,18-octaethyl-21H, 23H-porphyrinplatinum(II) (abbreviation: PtOEP), can be given. In addition, a rare-earth metal complex such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), or tris[1-(2-thenoyl)-3,3,3-trifluoroacetonato](monophenanthroline)europium(III) (abbreviation: Eu(TTA)$_3$(Phen)) performs light emission (electron transition between different multiplicities) from a rare-earth metal ion; therefore, such a rare-earth metal complex can be used as a phosphorescent compound of the present invention. From that viewpoint, phosphor of an inorganic compound such as metal oxide to which rare-earth metal is added can also be used.

As the hole transporting host material 121, specifically, an aromatic amine compound such as 4,4'-bis[N-(1-napthyl)-N-phenylamino]biphenyl (abbreviation: NPB), 4,4'-bis[N-(9-phenanthryl)-N-phenylamino]biphenyl (abbreviation: PPB), 4,4'-bis[N-(3-methylphenyl)-N-phenylamino]biphenyl (abbreviation: TPD), 4,4'-bis[N-(9,9-dimethylfluoren-2-yl)-N-phenylamino]biphenyl (abbreviation: DFLDPBi), 4,4',4"-tris(N,N-diphenylamino)triphenylamine (abbreviation: TDATA), 4,4',4"-tris[N-(3-methylphenyl)-N-phenylamino] triphenylamine (abbreviation: m-MTDATA), 4,4',4"-tri(N-carbazolyl)triphenylamine (abbreviation: TCTA), 1,1-bis[4-(diphenylamino)phenyl]cyclohexane (abbreviation: TPAC), 9,9-bis[4-(diphenylamino)phenyl]fluorene (abbreviation: TPAF), 4-(9-carbazolyl)-4'-(5-phenyl-1,3,4-oxadiazol-2-yl) triphenylamine (abbreviation: YGAO11), or N-[4-(9-carbazolyl)phenyl]-N-phenyl-9,9-dimethylfluorenyl-2-amine (abbreviation: YGAF) can be used. Further, a high molecular compound such as poly(4-vinyltriphenylamine) (abbreviation: PVTPA) can also be used.

As the electron transporting host material 122, specifically, a heteroaromatic compound such as 1,3-bis[5-(p-tert-buthylphenyl)-1,3,4-oxadiazol-2-yl]benzene (abbreviation: OXD-7), 2-(4-biphenylyl)-5-(4-tert-butylphenyl)-1,3,4-oxadiazole (abbreviation: PBD), tris[2-(2-hydroxyphenyl)-5-phenyl-1,3,4-oxadiazolato]aluminum(III) (abbreviation: Al(OXD)$_3$), bis[2-(2-hydroxyphenyl)benzoxazolato]zinc(II) (abbreviation:Zn(PBO)$_2$), 2,2',2"-(1,3,5-benzenetriyl)tris(1-phenyl-1H-benzimidazole) (abbreviation: TPBI), tris[2-(2-hydroxyphenyl)-1-phenyl-1H-benzimidazolato]aluminum (III) (abbreviation: Al(BIZ)$_3$), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 9,9',9"-[1,3,5-triazine-2,4,6-triyl]tricarbazole (abbreviation: TCzTRZ), 2,2',2"-(1,3,5-benzenetriyl)tris(6,7-dimethyl-3-phenylquinoxaline) (abbreviation: TriMeQn), tris(8-quinolinolato)aluminum (III) (abbreviation: Alq$_3$), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis[2-(2-hydroxyphenil)benzothiazolato]zinc(II) (abbreviation: Zn(BTZ)$_2$), bis(5-hydroxyquinoxalinato)zinc(II) (abbreviation: Zn(Qn)$_2$), bathophenanthroline (abbreviation: BPhen), or bathocuproin (abbreviation: BCP) can be used as well as an oxadiazole derivative, 9-[4-(5-phenyl-1,3,4-oxadiazol-2-yl)phenyl]carbazole (abbreviation: CO11), represented by the following structural formula (1). Further, a high molecular compound such as poly(2,5-pyridine-diyl) (abbreviation: PPy) can also be used. In particular, it is preferable to use a material having energy gap of 3.3 eV or less as the electron transporting host material 122.

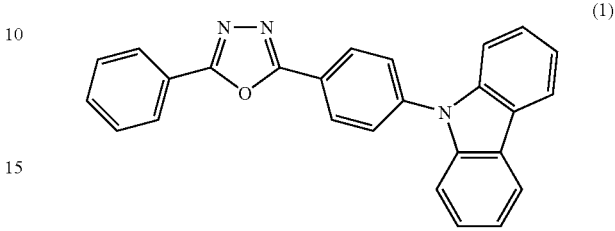

(1)

The first electrode 101 and the second electrode 102 are not limited in particular, and various conductive materials such as Al, Ag, and Cr can be used. Further, it is acceptable as long as at least one of the first electrode 101 and the second electrode 102 is a transparent electrode through which light emission can be extracted. For example, a transparent conductive material such as indium tin oxide (ITO), indium tin oxide containing silicon oxide (ITSO), or indium oxide containing zinc oxide of 2 to 20 wt % (IZO) can be used.

Embodiment Mode 2

In Embodiment Mode 2, the structure of the light-emitting element of the present invention will be explained in more detail. FIG. 2 shows an element structure thereof.

FIG. 2 shows a light-emitting element of the present invention having a first light-emitting layer 213 and a second light-emitting layer 214 provided to be in contact with each other between a first electrode 201 serving as an anode and a second electrode 202 serving as a cathode, where the first light-emitting layer 213 includes a hole transporting host material 221 and a phosphorescent compound 220, and the second light-emitting layer 214 includes an electron transporting host material 222 and the phosphorescent compound 220. That is, the phosphorescent compound added to the first light-emitting layer 213 and the phosphorescent compound added to the second light-emitting layer 214 are the same. The phosphorescent compound is dispersed in the first light-emitting layer and the second light-emitting layer as a guest material. Reference numeral 211 denotes a hole injecting layer; 212, a hole transporting layer; 215, an electron transporting layer; and 216, an electron injecting layer.

When a voltage is applied to such a light-emitting element, as shown in FIG. 2, a hole injected from the first electrode 201 side and an electron injected from the second electrode 202 side are recombined in the first light-emitting layer 213 and the second light-emitting layer 214. The phosphorescent compound 220 is excited by the recombination, and light is emitted when an excitation state of the phosphorescent compound returns to a ground state. At this time, the first light-emitting layer 213 includes the hole transporting host material 221, and the second light-emitting layer 214 includes the electron transporting host material 222. Therefore, a light-emitting region is formed in the vicinity of an interface between the first light-emitting layer 213 and the second light-emitting layer 214 or formed in both of the first light-emitting layer 213 and the second light-emitting layer 214. That is, a light-emitting region is not easily formed in the vicinity of the interface between the first light-emitting layer 213 and the hole transporting layer 212, and the interface between the second light-emitting layer 214 and the electron transporting layer 215. As a result, the following effect can be obtained.

First, the hole transporting host material 221 and the electron transporting host material 222 have triplet excitation energy higher than that of the phosphorescent compound 220 which is a light-emitting substance. Therefore, triplet excitation energy of the phosphorescent compound 220 is finely shut in the first light-emitting layer 213 and the second light-emitting layer 214, whereby the light-emitting element of the present invention can emit light effectively. The term "triplet excitation energy" means energy required in forming triplet excited state of a certain substance. Though it is difficult to directly obtain an absolute value thereof, approximate magnitude relation can be known from color or an emission wavelength of phosphorescent emission.

When the light-emitting region is formed in the vicinity of an interface between the first light-emitting layer 213 and the second light-emitting layer 214 or formed in both of the first light-emitting layer 213 and the second light-emitting layer 214, carrier balance is not easily disrupted. Accordingly, an effect of improving the life of the element can be obtained.

Figure 3A:
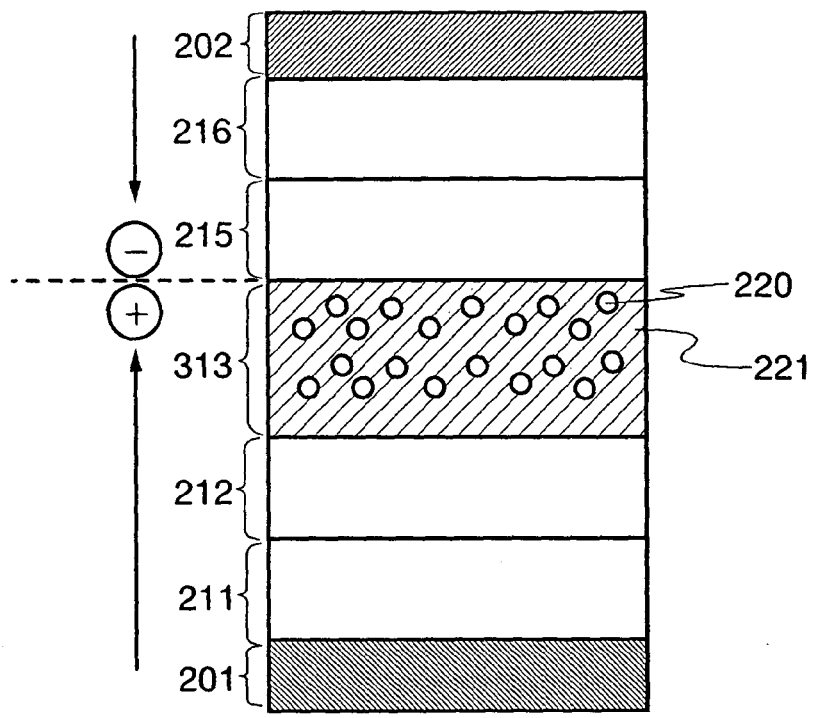
FIGS. 3A and 3B are explanatory views of an element structure of a conventional light-emitting element.

Next, such an element structure of the present invention and a conventional element structure (shown in FIGS. 3A and 3B) are compared. Reference numerals in FIG. 2 are also used in FIGS. 3A and 3B. FIG. 3A shows a conventional light-emitting element in which a light-emitting layer is formed using only a hole transporting light-emitting layer 313 in which a phosphorescent compound 220 is added to a hole transporting host material 221. In a case of such an element structure, since a light-emitting region exists in the vicinity of an interface between the hole transporting light-emitting layer 313 and an electron transporting layer 215, it is necessary that triplet excitation energy of a substance to be used for the electron transporting layer 215 is made higher than that of the phosphorescent compound 220. Therefore, a substance to be used for the electron transporting layer 215 is also limited. On the other hand, with the element structure of the present invention, there is no limitation on triplet excitation energy, and accordingly, a stable and general-purpose (inexpensive) substance with low triplet excitation energy (for example, $Alq_3$) can be used as the electron transporting layer 215.

Figure 3B:
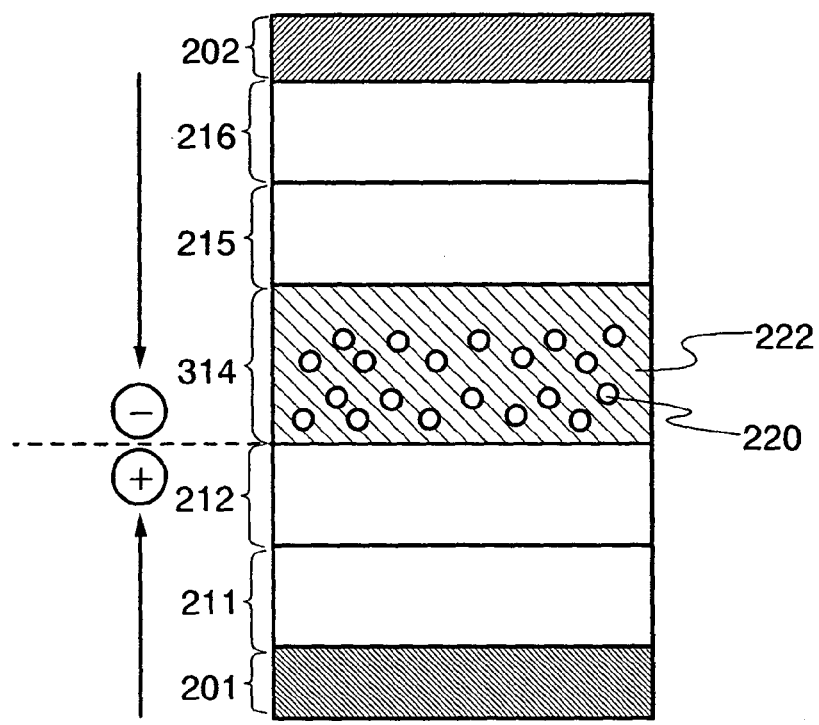

FIG. 3B shows a conventional light-emitting element in which a light-emitting layer is formed using only an electron transporting light-emitting layer 314 in which a phosphorescent compound 220 is added to an electron transporting host material 222. In a case of such an element structure, since a light-emitting region exists in the vicinity of an interface between the electron transporting light-emitting layer 314 and a hole transporting layer 212, it is necessary that triplet excitation energy of a substance to be used for the hole transporting layer 212 is made higher than that of the phosphorescent compound 220. Therefore, a substance to be used for the hole transporting layer 212 is also limited. On the other hand, with the element structure of the present invention, there is no limitation on triplet excitation energy, and accordingly, a stable and general-purpose (inexpensive) substance with low triplet excitation energy (for example, NPB) can be used as the hole transporting layer 212.

The phosphorescent compound 220 may be added to part of the first light-emitting layer 213, not the entire region thereof. In the similar manner, the phosphorescent compound 220 may be added to part of the second light-emitting layer 214, not the entire region thereof.

Subsequently, a material which can be used for the light-emitting element of the present invention will be specifically exemplified. However, various materials can be used in the present invention, without being limited to explanation to be given below.

First, as the phosphorescent compound 220, specifically, an organic metal complex such as bis[2-(4',6'-difluorophenyl)pyridinato-N,C 2']iridium(III)tetrakis(1-pyrazolyl)borate (abbreviation: FIr6), bis[2-(4',6'-difluorophenyl)pyridinato-N,$C^{2'}$]iridium(III)picolinate (abbreviation: FIrpic), bis[2-(3',5'bistrifluoromethylphenyl)pyridinato-N,$C^{2'}$]iridium (III) picolinate (abbreviation: Ir($CF_3$ppy)$_2$(pic)), bis[2-(4',6'-difluorophenyl)pyridinato-N,$C^{2'}$]iridium(III)acetylacetonate (abbreviation: FIr(acac)), tris(2-phenylpyridinato-N,$C^{2'}$)iridium(III) (abbreviation: Ir(ppy)$_3$), bis(2-phenylpyridinato-N,$C^{2'}$)iridium(III)acetylacetonate (abbreviation: Ir(ppy)$_2$(acac)), bis(1,2-diphenyl-1H-benzimidazolato)iridium(III) acetylacetonate (abbreviation: Ir(pbi)$_2$(acac)), bis(benzo[h]quinolinato)iridium(III)acetylacetonate (abbreviation: Ir(bzq)$_2$(acac)), bis(2,4-diphenyl-1,3-oxazolato-N,$C^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)), tris(2-phenylquinolinato-N,$C^{2'}$) iridium(III) (abbreviation: Ir(pq)$_3$), bis(2-phenylquinolinato-N,$C^{2'}$)iridium(III)acetylacetonate (abbreviation: Ir(pq)$_2$(acac)), bis[2-(2'-benzo[4,5-α]thienyl)pyridinato-N,$C^{3'}$) iridium(III)acetylacetonate (abbreviation: Ir(btp)$_2$(acac)), bis (1-phenylisoquinolinato-N,$C^{2'}$)iridium(III)acetylacetonate (abbreviation: Ir(piq)$_2$(acac)), (acetylacetonato)bis[2,3-bis (4-fluorophenyl)quinoxalinato]iridium(Ill) (abbreviation: Ir(Fdpq)$_2$(acac)), or 2,3,7,8,12,13,17,18-octaethyl-21H, 23H-porphyrinplatinum(II) (abbreviation: PtOEP), can be given. In addition, a rare-earth metal complex such as tris (acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), or tris[1-(2-thenoyl)-3,3,3-trifluoroacetonato](monophenanthroline)europium(III) (abbreviation: Eu(TTA)$_3$(Phen)) performs light emission (electron transition between different multiplicities) from a rare-earth metal ion; therefore, such a rare-earth metal complex can be used as a phosphorescent compound of the present invention. From that viewpoint, phosphor of an inorganic compound such as metal oxide to which rare-earth is added can also be used.

As the hole transporting host material 221, specifically, an aromatic amine compound such as 4,4'-bis[N-(1-napthyl)-N-phenylamino]biphenyl (abbreviation: NPB), 4,4'-bis[N-(9-phenanthryl)-N-phenylamino]biphenyl (abbreviation: PPB), 4,4'-bis[N-(3-methylphenyl)-N-phenylamino]biphenyl (abbreviation: TPD), 4,4'-bis[N-(9,9-dimethylfluoren-2-yl)-N-phenylamino]biphenyl (abbreviation: DFLDPBi), 4,4',4"-tris (N,N-diphenylamino)triphenylamine (abbreviation: TDATA), 4,4',4"-tris[N-(3-methylphenyl)-N-phenylamino] triphenylamine (abbreviation: m-MTDATA), 4,4',4"-tri(N-carbazolyl)triphenylamine (abbreviation: TCTA), 1,1-bis[4-(diphenylamino)phenyl]cyclohexane (abbreviation: TPAC), 9,9-bis[4-(diphenylamino)phenyl]fluorene (abbreviation: TPAF), 4-(9-carbazolyl)-4'-(5-phenyl-1,3,4-oxadiazol-2-yl) triphenylamine (abbreviation: YGAO11), or N-[4-(9-carbazolyl)phenyl]-N-phenyl-9,9-dimethylfluorenyl-2-amine (abbreviation: YGAF) can be used. Further, a high molecular compound such as poly(4-vinyltriphenylamine) (abbreviation: PVTPA) can also be used.

Although these materials are all aromatic amine compounds, it is preferable to use the aromatic amine compound as the hole transporting host material in this manner because a hole transporting property of the first light-emitting layer 213 becomes high, and the light-emitting region is easily designed in the vicinity of the interface between the first light-emitting layer 213 and the second light-emitting layer 214. Further, it is also preferable because film quality of the first light-emitting layer 213 becomes stable, which leads to the long life of the element. Among the aromatic amine compounds, a triaryl amine compound such as TDATA, m-MTDATA, TCTA, TPAC, TPAF, YGAO11, or YGAF is particularly preferable as a host material because of its high triplet excitation energy.

As the electron transporting host material 222, specifically, a heteroaromatic compound such as 1,3-bis[5-(p-tert-buthylphenyl)-1,3,4-oxadiazol-2-yl]benzene (abbreviation: OXD-7), 2-(4-biphenylyl)-5-(4-tert-butylphenyl)-1,3,4-oxadiazole (abbreviation: PBD), tris[2-(2-hydroxyphenyl)-5-phenyl-1,3,4-oxadiazolato]aluminum(III) (abbreviation: Al(OXD)$_3$), bis[2-(2-hydroxyphenyl)benzoxazolato]zinc(II) (abbreviation:Zn(PBO)$_2$), 2,2',2"-(1,3,5-benzenetriyl)tris(1-phenyl-1H-benzimidazole) (abbreviation: TPBI), tris[2-(2-hydroxyphenyl)-1-phenyl-1H-benzimidazolato]aluminum (III) (abbreviation: Al(BIZ)$_3$), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 9,9',9"-[1,3,5-triazine-2,4,6-triyl]tricarbazole (abbreviation: TCzTRZ), 2,2',2"-(1,3,5-benzenetriyl)tris(6,7-dimethyl-3-phenylquinoxaline) (abbreviation: TriMeQn), tris(8-quinolinolato)aluminum (III) (abbreviation: Alq$_3$), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis[2-(2-hydroxyphenil)benzothiazolato]zinc(II) (abbreviation: Zn(BTZ)$_2$), bis(5-hydroxyquinoxalinato)zinc(II) (abbreviation: Zn(Qn)$_2$), bathophenanthroline (abbreviation: BPhen), or bathocuproin (abbreviation: BCP) can be used as well as an oxadiazole derivative, 9-[4-(5-phenyl-1,3,4-oxadiazol-2-yl)phenyl]carbazole (abbreviation: CO11), represented by the structural formula (1) described in Embodiment Mode 1. Further, a high molecular compound such as poly(2,5-pyridine-diyl) (abbreviation: PPy) can also be used. In particular, it is preferable to use a material having energy gap of 3.3 eV or less as the electron transporting host material 222.

Although these materials are all heteroaromatic amine compounds, it is preferable to use the heteroaromatic amine compound as the electron transporting host material in this manner because an electron transporting property of the second light-emitting layer 214 becomes high, and the light-emitting region is easily designed in the vicinity of the interface between the first light-emitting layer 213 and the second light-emitting layer 214. Among the heteroaromatic amine compounds, an oxadiazole derivative such as CO11, OXD-7, PBD, or Al(OXD)$_3$, an oxazole derivative such as Zn(PBO)$_3$, an imidazole derivative such as TPBI or Al(BIZ)$_3$ or a triazine derivative such as TCzTRZ is particularly preferable as a host material because of its high triplet excitation energy.

The hole transporting layer 212 and the hole injecting layer 211 are not necessarily required, and may be appropriately provided. As a specific material which forms these layers, a hole transporting compound is preferable. In addition to the above-described NPB, PPB, TPD, DFLDPBi, TDATA, m-MTDATA, TCTA, TPAC, TPAF, YGAO11, YGAF, and PVTPA, an anthracene derivative such as 9,10-bis[4-(diphenylamino)phenyl]anthracene (abbreviation: TPA2A) or 2-tert-butyl-9,10-di(2-naphthyl)anthracene (abbreviation: t-BuDNA) can also be used. The hole transporting layer 212 and the hole injecting layer may be formed by mixing these materials and an electron acceptor. As the electron acceptor, in addition to an organic compound such as chloranil or 7,7,8,8-tetracyano-2,3,5,6-tetrafluoroquinodimethane (abbreviation: F$_4$-TCNQ), transition metal oxide such as molybdenum oxide, vanadium oxide, or rhenium oxide can be used. In particular, as the hole injecting layer 211, an organic compound such as copper phthalocyanine, vanadyl phthalocyanine, or fluorocarbon, or an inorganic compound such as molybdenum oxide, ruthenium oxide, or aluminum oxide can also be used. The hole injecting layer 211 may have a multilayer structure formed by stacking two or more layers. Further, the hole injecting layer 211 and the hole transporting layer 212 may be formed by mixing two or more kinds of substances.

The electron transporting layer 215 and the electron injecting layer 216 are not necessarily required, and may be appropriately provided. As a specific material which forms these layers, an electron transporting compound is preferable. The above-described CO11, OXD-7, PBD, Al(OXD)$_3$, Zn(PBO)$_2$, TPBI, Al(BIZ)$_3$, TAZ, p-EtTAZ, TCzTRZ, TriMeQn, Alq$_3$, Almq$_3$, BeBq$_2$, BAlq, Zn(BTZ)$_2$, Zn(Qn)$_2$, BPhen, BCP, PPy, or the like can be used. The electron transporting layer 215 and the electron injecting layer 216 may be formed by mixing these materials and an electron donor. As the electron donor, in addition to an organic compound such as tetrathiafulvalene, alkali metal such as lithium or cesium, alkaline earth metal such as magnesium or calcium, rare-earth metal such as erbium or ytterbium, or an oxide of these metals can be used. In particular, as the electron injecting layer 216, an alkali metal compound such as lithium oxide, lithium fluoride, calcium fluoride, erbium fluoride, an alkaline earth metal compound, or a rare-earth metal compound can be used by itself. The electron injecting layer 216 may have a multilayer structure formed by stacking two or more layers. Further, the electron transporting layer 215 and the electron injecting layer 216 may be formed by mixing two or more kinds of substances.

Incidentally, in the light-emitting element of the present invention, even when the hole transporting compound used for the hole transporting layer 212 and the electron transporting compound used for the electron transporting layer 215, which are described above, have triplet excitation energy lower than that of the phosphorescent compound 220, light can be emitted effectively. Accordingly, the light-emitting element of the present invention has a feature that a stable and general-purpose (inexpensive) substance with low triplet excitation energy (for example, NPB) can be used as the hole transporting layer 212. Further, the light-emitting element of the present invention has a feature that a stable and general-purpose (inexpensive) substance with low triplet excitation energy (for example, Alq$_3$) can be used as the electron transporting layer 215.

For example, it is reported that emission color of phosphorescence of NPB which is a stable and general-purpose (inexpensive) hole transporting compound is yellow (in the vicinity of 540 to 550 nm). Therefore, in a case where the conventional element structure shown in FIG. 3B is applied, light cannot be emitted effectively even when a substance emitting light with a shorter wavelength (specifically, corresponding to blue, bluish green, green, or yellowish green light emission with the maximum peak wavelength of 450 to 540 nm) than yellowish green is used as the phosphorescent compound 220. However, with the element structure of the present invention, light can be emitted effectively. As the phosphorescent compound showing light emission with a shorter wavelength than yellowish green (specifically, corresponding to blue, bluish green, green, or yellowish green light emission with the maximum peak wavelength of 450 to 540 nm), among the above-described phosphorescent compounds, FIr6, FIrpic, Ir (CF$_3$ppy)$_2$(Pic), FIracac, Ir(ppy)$_3$, Ir(ppy)$_2$(acac), Ir(pbi)$_2$(acac), Ir(bzq)$_2$(acac), Tb(acac)$_3$(Phen), or the like corresponds.

For example, it is reported that emission color of phosphorescence of Alq$_3$ which is a stable and general-purpose (inexpensive) electron transporting compound is deep red (in the vicinity of 650 to 700 nm). Therefore, in a case where the conventional element structure shown in FIG. 3A is applied, light cannot be emitted effectively even when a substance emitting light with a shorter wavelength than deep red is used as the phosphorescent compound 220. However, with the element structure of the present invention, light can be emitted effectively. As the phosphorescent compound showing light emission with a shorter wavelength than deep red, among the phosphorescent compounds, FIr6, FIrpic, Ir(CF$_3$ppy)$_2$(pic), FIracac, Ir(ppy)$_3$, Ir(ppy)$_2$(acac), Ir(pbi)$_2$(acac), Ir(bzq)$_2$(acac), Tb(acac)$_3$(Phen), Ir(dpo)$_2$(acac), Ir(p-PF-ph)$_2$(acac), Ir(bt)$_2$(acac), Ir(pq)$_3$, Ir(pq)$_2$(acac), Ir(btp)$_2$(acac), Ir(piq)$_2$(acac), Ir(Fdpq)$_2$(acac), PtOEP, Eu(DBM)$_3$(Phen), Eu(TTA)$_3$(Phen), or the like corresponds.

Although the first electrode 101 is not limited in particular, as described in Embodiment Mode 2, the first electrode 101 is preferably formed using a substance with high work function when the first electrode 101 serves as an anode. Specifically, in addition to indium tin oxide (ITO), indium tin oxide containing silicon oxide (ITSO), or indium oxide containing 2 to 20 wt % of zinc oxide (IZO), gold (Au), platinum (Pt), nickel (Ni), tungsten (W), chromium (Cr), molybdenum (Mo), iron (Fe), cobalt (Co), copper (Cu), palladium (Pd), or the like can be used. The first electrode 101 can be formed by, for example, a sputtering method, an evaporation method, or the like.

Although the second electrode 102 is not limited in particular, as described in Embodiment Mode 2, the second electrode 102 is preferably formed using a substance with low work function when the second electrode 102 serves as a cathode. Specifically, in addition to aluminum (Al) or indium (In), alkali metal such as lithium (Li) or cesium (Cs), alkaline earth metal such as magnesium (Mg) or calcium (Ca), or rare-earth metal such as erbium (Er) or ytterbium (Yb) can be used. In addition, alloy such as aluminum-lithium alloy (AlLi) or magnesium-silver alloy (MgAg) can also be used. The second electrode 102 can be formed by, for example, a sputtering method, an evaporation method, or the like.

In order to extract emitted light, it is preferable that one or both of the first electrode 101 and the second electrode 102 be an electrode formed using a conductive film through which visible light is transmitted, such as ITO, or an electrode formed to have a thickness of several to several tens of nm so that visible light can be transmitted.

In the light-emitting element of the present invention described above, each of the hole injecting layer 211, the hole transporting layer 212, the first light-emitting layer 213, the second light-emitting layer 214, the electron transporting layer 215, and the electron injecting layer 216 may be formed by any method such as an evaporation method, an ink-jet method, or a coating method. The first electrode 101 or the second electrode 102 may also be formed by any method such as a sputtering method, an evaporation method, an inkjet method, or a coating method.

Embodiment Mode 3

Figure 4A:
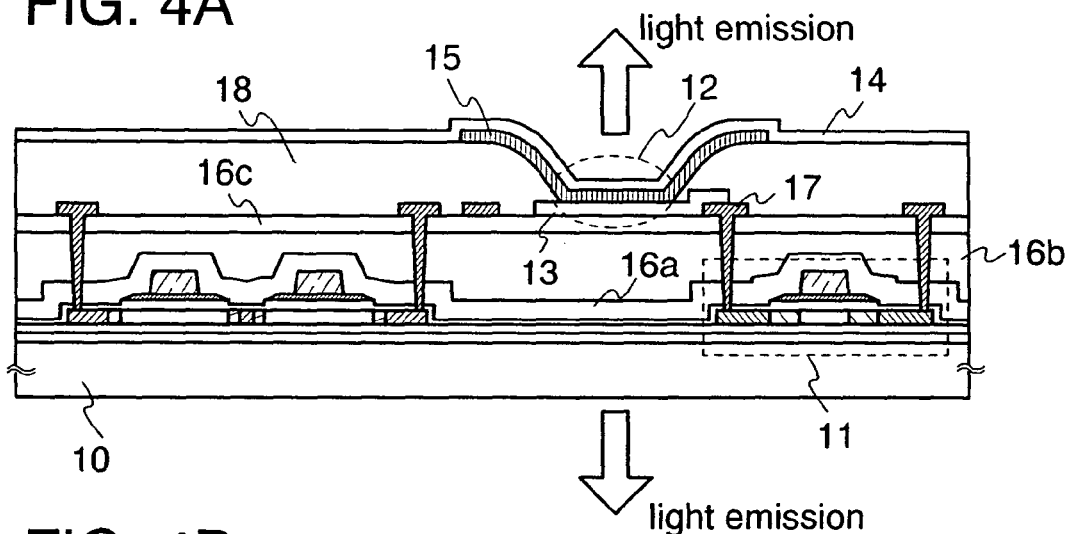
FIGS. 4A to 4C are explanatory views of a light-emitting device using a light-emitting element of the present invention.
Figure 4B:
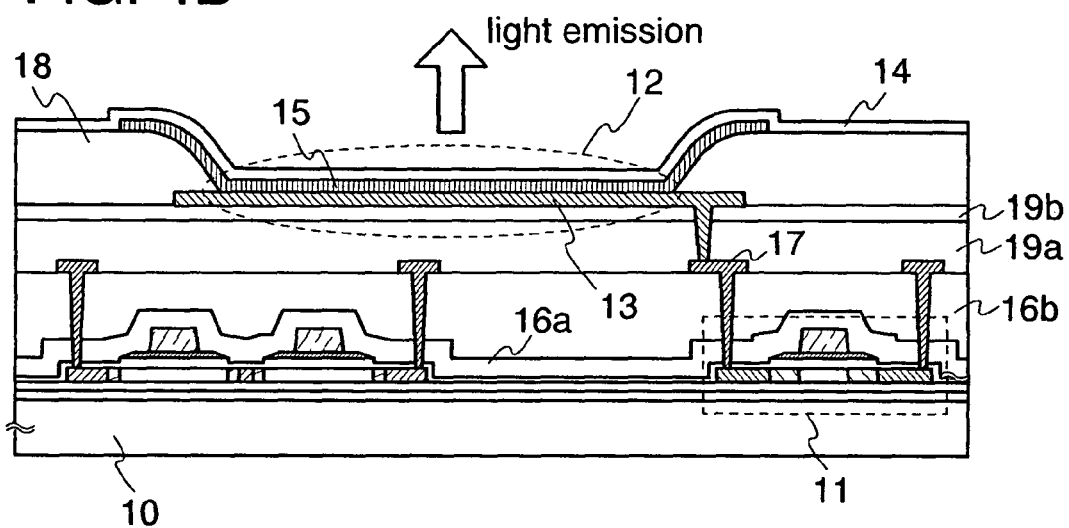
Figure 4C:
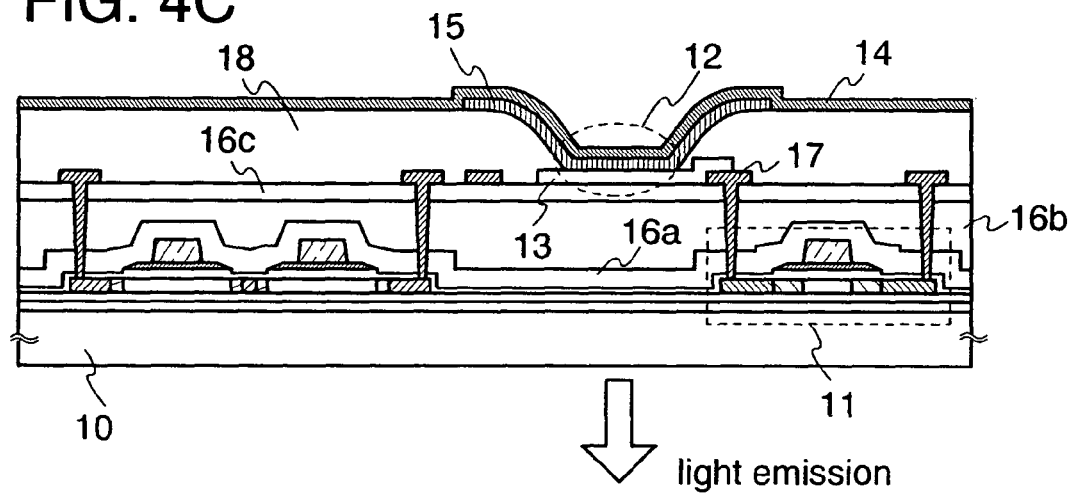

Embodiment Mode 3 explains a mode of a light-emitting device including the light-emitting element of the present invention with reference to FIGS. 4A to 4C. FIGS. 4A to 4C show cross-sectional views of the light-emitting device.

In FIGS. 4A to 4C, a portion surrounded by dotted lines of a rectangular shape is a transistor 11 which is provided to drive a light-emitting element 12 of the present invention. The light-emitting element 12 is a light-emitting element of the present invention in which a layer 15 including a light-emitting layer is formed between a first electrode 13 and a second electrode 14. Specifically, the light-emitting element 12 has the structure as shown in Embodiment Modes 1 and 2. A drain region of the transistor 11 is electrically connected to the first electrode 13 by a wiring 17 penetrating a first interlayer insulating film 16 (16a, 16b, and 16c). The light-emitting element 12 is separated from other adjacently-provided light-emitting elements by a partition layer 18. The light-emitting device having such a structure of the present invention is provided over a substrate 10 in Embodiment Mode 3.

Note that each of the transistors 11 shown in FIGS. 4A to 4C is a top gate type in which a gate electrode is provided on a side opposite to a substrate, regarding the semiconductor layer as a center. However, there are no particular limitations on the structure of the transistor 11; for example, a bottom gate type may be used. In the case of a bottom gate type, the transistor 11 may have a structure in which a protective film is formed over the semiconductor layer forming a channel (a channel protective type) or a structure in which a part of the semiconductor layer forming a channel is depressed (a channel etch type).

Alternatively, the semiconductor layer included in the transistor 11 may be either crystalline or amorphous. Further, it may be semiamorphous or the like.

Note that the semiamorphous semiconductor is as follows. It has an intermediate structure between an amorphous structure and a crystalline structure (including a single crystal and a polycrystal) and a third state which is stable in terms of free energy, and it includes a crystalline region having short-range order and lattice distortion. At least a part of a region in the film contains a crystal grain of 0.5 nm to 20 nm. A Raman spectrum derived from L-O phonon is shifted to a lower wavenumber side than 520 cm$^{-1}$. Diffraction peaks of (111) and (220) caused by a crystal lattice of Si are observed in X-ray diffraction. Hydrogen or halogen of at least 1 atomic % is contained to terminate a dangling bond. It is also referred to as a microcrystalline semiconductor. The semiamorphous semiconductor is formed by glow discharge decomposition (plasma CVD) on a gas including silicide. SiH$_4$ is given as the gas including silicide. In addition, Si$_2$H$_6$, SiH$_2$Cl$_2$, SiHCl$_3$, SiCl$_4$, SiF$_4$, or the like can also be used as the gas including silicide. The gas including silicide may be diluted with H$_2$, or H$_2$ and one or more rare gas elements of He, Ar, Kr, and Ne. A dilution ratio thereof may range from 2 times to 1000 times; pressures, approximately 0.1 Pa to 133 Pa; power supply frequency, 1 MHz to 120 MHz, preferably, 13 MHz to 60 MHz. A substrate heating temperature may be less than or equal to 300° C., preferably, 100° C. to 250° C. A concentration of an atmospheric constituent impurity such as oxygen, nitrogen, or carbon, as impurities element in the film, is preferably 1×10$^{20}$ atoms/cm$^3$ or less; specifically, a concentration of oxygen is less than or equal to 5×10$^{19}$ atoms/cm$^3$, preferably less than or equal to 1×10$^{19}$ atoms/cm$^3$. Note that the mobility of a TFT (thin film transistor) using the semiamorphous semiconductor is approximately 1 cm$^2$/Vsec to 10 cm$^2$/Vsec.

As a specific example of the crystalline semiconductor layer, a layer formed of single crystal or polycrystalline silicon, silicon germanium, or the like can be given. It may be formed by laser crystallization or may be formed by crystallization through a solid phase growth method using, for example, nickel.

When the semiconductor layer is formed of an amorphous substance, for example, amorphous silicon, a light-emitting device preferably has a circuit in which the transistor 11 and the other transistors (transistors included in a circuit for driving a light-emitting element) are all n-channel transistors. Other than this point, a light-emitting device may have a circuit including either n-channel transistors or p-channel transistors, or a light-emitting device may have a circuit including both types of transistors.

The first interlayer insulating films 16a to 16c may have a multilayer structure as shown in FIGS. 4A and 4C, or a single-layer structure. Note that the interlayer insulating film 16a is made from an inorganic material such as silicon oxide or silicon nitride; the interlayer insulating film 16b is made from acrylic, siloxane (an organic group including a skeleton of a silicon-oxygen bond (Si—O bond) and including at least hydrogen as a substituent) or a self-planarizing substance which can be formed as a film by an application method, such as silicon oxide. In addition, the interlayer insulating film 16c is made from a silicon nitride film containing argon (Ar). Note that there are no particular limitations on materials forming each layer, and a material other than the foregoing materials may also be used. A layer made from a material other than the foregoing materials may be further combined. As described above, the first interlayer insulating films 16a to 16c may be formed using either an inorganic material or an organic material, or both of them.

The partition layer 18 preferably has a shape in which a curvature radius changes continuously in an edge portion. In addition, the partition layer 18 is formed with acrylic, siloxane, resist, silicon oxide, or the like. Note that the partition layer 18 may be formed using either an inorganic material or an organic material, or both of them.

In FIGS. 4A and 4C, only the first interlayer insulating films 16a to 16c are provided between the transistor 11 and the light-emitting element 12. However, as shown in FIG. 4B, a second interlayer insulating film 19 (19a and 19b) may also be provided in addition to the first interlayer insulating film 16 (16a and 16b). In the light-emitting device shown in FIG. 4B, the first electrode 13 penetrates the second interlayer insulating film 19 and connects to the wiring 17.

The second interlayer insulating film 19 may have a multilayer structure or a single-layer structure in the similar manner to the first interlayer insulating film 16. The second interlayer insulating film 19a is made from acrylic, siloxane (an organic group including a skeleton of a silicon-oxygen bond (Si—O bond) and including at least hydrogen as a substituent), or a self-planarizing substance which can be formed as a film by an application method, such as silicon oxide. The second interlayer insulating film 19b is formed from a silicon nitride film containing argon (Ar). Note that there are no particular limitations on materials forming each layer, and a material other than the foregoing materials can also be used. A layer made from a material other than the foregoing materials may be further combined. As described above, the second interlayer insulating film 19 may be formed using either an inorganic material or an organic material, or both of them.

When both the first electrode 13 and the second electrode 14 are formed using light-transmitting materials in the light-emitting element 12, light emission can be extracted through both the first electrode 13 and the second electrode 14 as indicated by the outlined arrows in FIG. 4A. When only the second electrode 14 is formed using a light-transmitting material, light emission can be extracted through only the second electrode 14 as indicated by the outlined arrow in FIG. 4B. In this case, it is preferable to form the first electrode 13 using a highly reflective material or provide a film formed using a highly reflective material (reflective film) below the first electrode 13. When only the first electrode 13 is formed using a light-transmitting material, light emission can be extracted through only the first electrode 13 as indicated by the outlined arrow in FIG. 4C. In this case, it is preferable to form the second electrode 14 using a highly reflective material or provide a reflective film above the second electrode 14.

In the light-emitting element 12, the layer 15 may have such a stacked structure as to operate the light-emitting element 12 when a voltage is applied so that a potential of the second electrode 14 becomes higher than that of the first electrode 13, or the layer 15 may have such a stacked structure as to operate the light-emitting element 12 when a voltage is applied so that a potential of the second electrode 14 becomes lower than that of the first electrode 13. In the former case, the transistor 11 is an n-channel transistor, and in the latter case, the transistor 11 is a p-channel transistor.

As described above, an active light-emitting device in which drive of the light-emitting element is controlled by transistors is explained in Embodiment mode 3. However, a passive light-emitting device, in which the light-emitting element is driven without providing a particular drive element such as a transistor, may also be employed.

Since the light-emitting device shown in Embodiment Mode 3 uses the light-emitting element of the present invention, the light-emitting device shown in Embodiment Mode 3 has high luminous efficiency and long life. Therefore, the light-emitting device has a feature of low power consumption and long life.

Embodiment Mode 4

A light-emitting device using the light-emitting element of the present invention can display a preferable image. Therefore, electronic devices that are capable of providing an excellent image can be obtained by applying the light-emitting device of the present invention to display portions of the electronic devices. In addition, the light-emitting device including the light-emitting element of the present invention consumes low power and has long life. Therefore, electronic devices with low power consumption can be obtained by applying the light-emitting device of the present invention to the display portions of the electronic devices, and for example, a telephone or the like that has long battery standing time, and the like can be obtained. Hereinafter, an embodiment of electronic devices incorporating a light-emitting device to which a light-emitting element of the present invention is applied is shown.

Figure 5A:
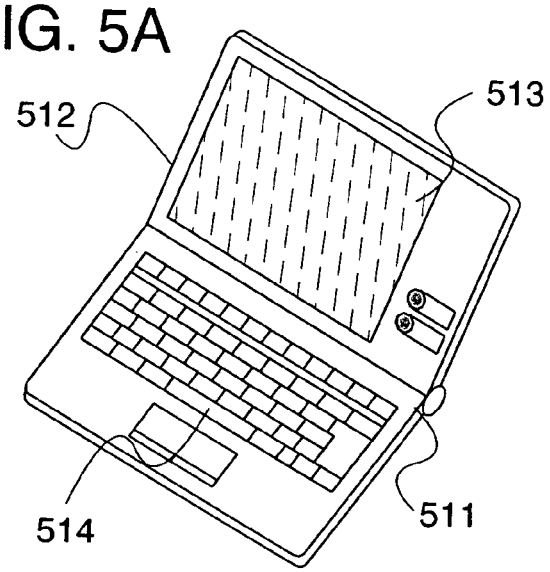
FIGS. 5A to 5C are explanatory views of an electronic device using a light-emitting device of the present invention.

FIG. 5A is a computer manufactured by applying the present invention, which includes a main body 511, a casing 512, a display portion 513, a keyboard 514, and the like. The computer can be completed by incorporating the light-emitting device including the light-emitting element of the present invention in the display portion.

Figure 5B:
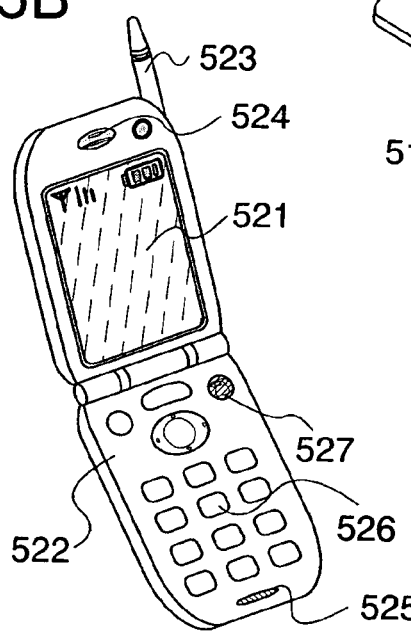

FIG. 5B is a telephone manufactured by applying the present invention, in which a main body 522 includes a display portion 521, an audio output portion 524, an audio input portion 525, operation switches 526 and 527, an antenna 523, and the like. The telephone can be completed by incorporating the light-emitting device including the light-emitting element of the present invention in the display portion.

Figure 5C:
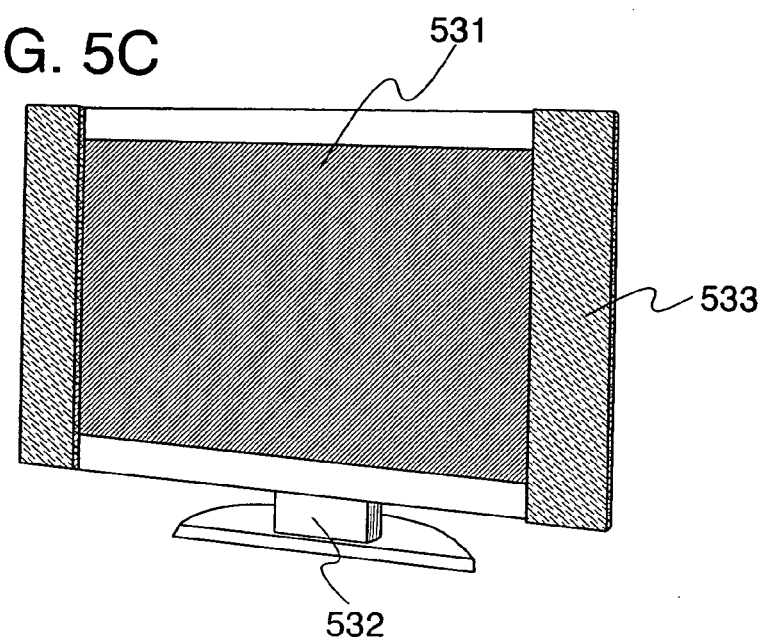

FIG. 5C is a television set manufactured by applying the present invention, which includes a display portion 531, a casing 532, a speaker 533, and the like. The television set can be completed by incorporating the light-emitting device including the light-emitting element of the present invention in the display portion.

As described above, the light-emitting devices of the present invention are extremely suitable for the display portions of various kinds of electronic devices.

Although the computer and the like are described in Embodiment Mode 4, besides, the light-emitting device having the light-emitting element of the present invention may also be mounted in a navigation system, a lighting apparatus, or the like.

EXAMPLE 1

<<Synthesis Example>>

Example 1 specifically exemplifies a synthesis example of 9-[4-(5-phenyl-1,3,4-oxadiazol-2-yl)phenyl]carbazole (abbreviation: CO11) that is useful as an electron transporting host material in a light-emitting element of the present invention. The structural formula (1) shows a structural formula of CO11.

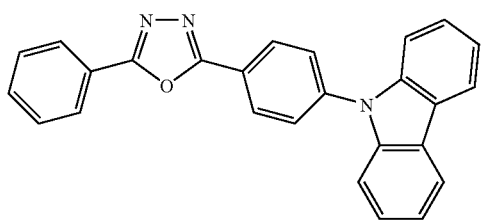

(1)

Step 1; Synthesis of 2-(4-bromophenyl)-5-phenyl-1,3,4-oxadiazole (abbreviation: O11Br)

In Step 1, O111Br was synthesized according to (i) to (iii) shown below.

(i) Synthesis of 4-bromobenzohydrazide

First, 3.0 g (13.9 mmol) of methyl-4-bromobenzoate was put in a 100-mL three-neck flask, 10 mL of ethanol was added thereto, and the mixture was stirred. Thereafter, 4.0 mL of hydrazine monohydrate was added thereto, and the mixture was heated and stirred at 78° C. for 5 hours. The obtained solid was washed with water and collected by suction filtration; thus, 2.0 g of a white solid of 4-bromobenzohydrazide that was an object was obtained in the yield of 67%.

(ii) Synthesis of 1-benzoyl-2-(4-bromobenzoyl)hydrazine

Subsequently, 2.0 g (13.9 mmol) of the 4-bromobenzohydrazide obtained in (i) above was put in a 300-mL three-neck flask, 7 ml of N-methyl-2-pyrrolidone (abbreviation: NMP) was added thereto, and the mixture was stirred. Thereafter, a mixture of 2.5 mL of N-methyl-2-pyrrolidone and 2.5 mL (21.5 mmol) of benzoyl chloride was dripped through a 50-mL dropping funnel, and the mixture was stirred at 80° C. for 3 hours. The obtained solid was washed with water and a sodium carbonate aqueous solution in this order and collected by suction filtration. Then, the solid was recrystallized with acetone; thus, 3.6 g of a white solid of 1-benzoyl-2-(4-bromobenzoyl)hydrazine that was an object was obtained in the yield of 80%.

(iii) Synthesis of O11Br

Further, 15 g (47 mmol) of the 1-benzoyl-2-(4-bromobenzoyl)hydrazine obtained by the method shown in (ii) above was put in a 200-mL three-neck flask, 100 mL of phosphoryl chloride was added thereto, and the mixture was heated and stirred at 100° C. for 5 hours. After the reaction, the solid obtained by completely distilling off phosphoryl chloride was washed with water and a sodium carbonate aqueous solution in this order and collected by suction filtration. Then, the solid was recrystallized with 5 methanol; thus, 13 g of a white solid of O11Br that was an object of Step 1 was obtained in the yield of 89%. A synthesis scheme of Step 1 described above is shown in the following scheme (a).

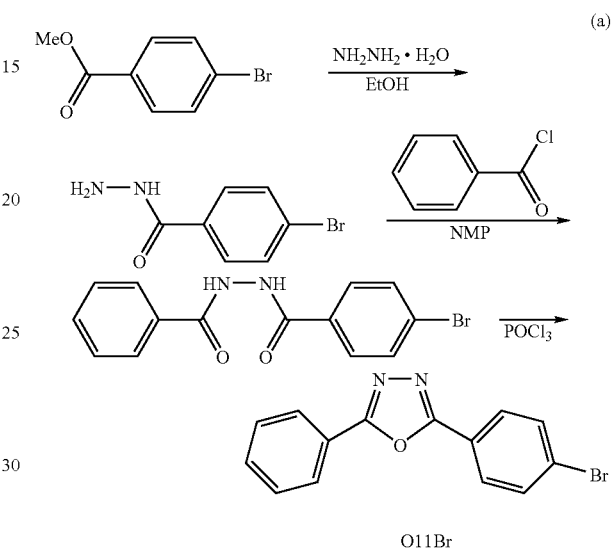

(a)

Step 2; Synthesis of 9-[4-(5-phenyl-1,3,4-oxadiazol-2-yl)-phenyl]carbazole (abbreviation: CO11)

3.0 g (10 mmol) of the O11Br obtained in the above Step 1, 1.7 g (10 mmol) of carbazole and 1.6 g (17 mmol) of sodium tert-butoxide were put in a 100-mL three-neck flask and nitrogen substitution was carried out, and thereafter, 40 mL of toluene, 0.2 mL of a 10% hexane solution of tritert-butylphosphine, and 0.2 g (0.4 mmol) of bis(dibenzylideneacetone) palladium(0) were added thereto, and the mixture was stirred at 80° C. for 5 hours. After the stir, the obtained mixture was filtered through Celite, and the filtrate was washed with water and dried with magnesium sulfate. Thereafter, magnesium sulfate was removed by filtration, and the filtrate was concentrated. The obtained solid was dissolved in toluene and purified by silica gel column chromatography. Purification by column chromatography was performed by using toluene as a developing solvent and then using a mixed solvent of toluene:ethyl acetate=1:5 as a developing solvent. The solution after being purified by column chromatography was concentrated and the obtained solid was recrystallized with chloroform and hexane; thus, a light yellow solid was obtained (the yield: 2.9 g and 74%). Then, sublimation purification of the obtained light yellow solid was performed by a train sublimation method; thus, CO11 that was an object was obtained. The sublimation purification was performed at 220° C. for 15 hours under a reduced pressure of 7 Pa, setting the flow rate of argon to be 3 mL/min. When sublimation purification was performed on 2.8 g, the yield was 1.8 g and 64%. The synthesis scheme of Step 2 is shown in the following scheme (b).

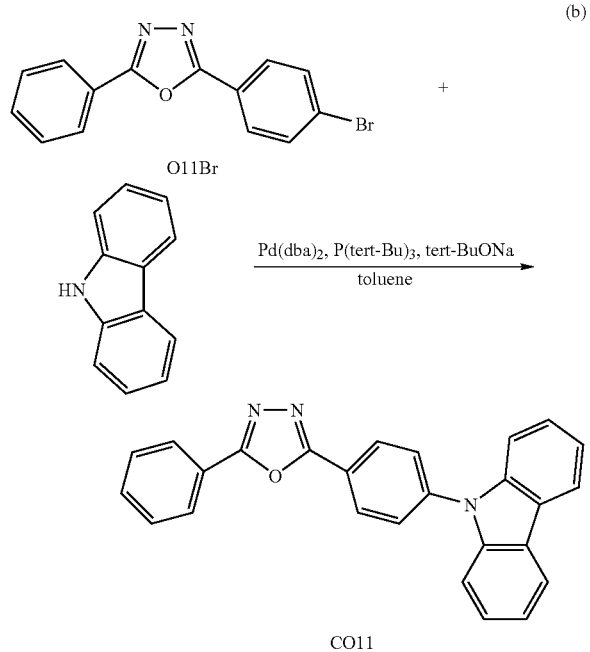

Figure 6A:
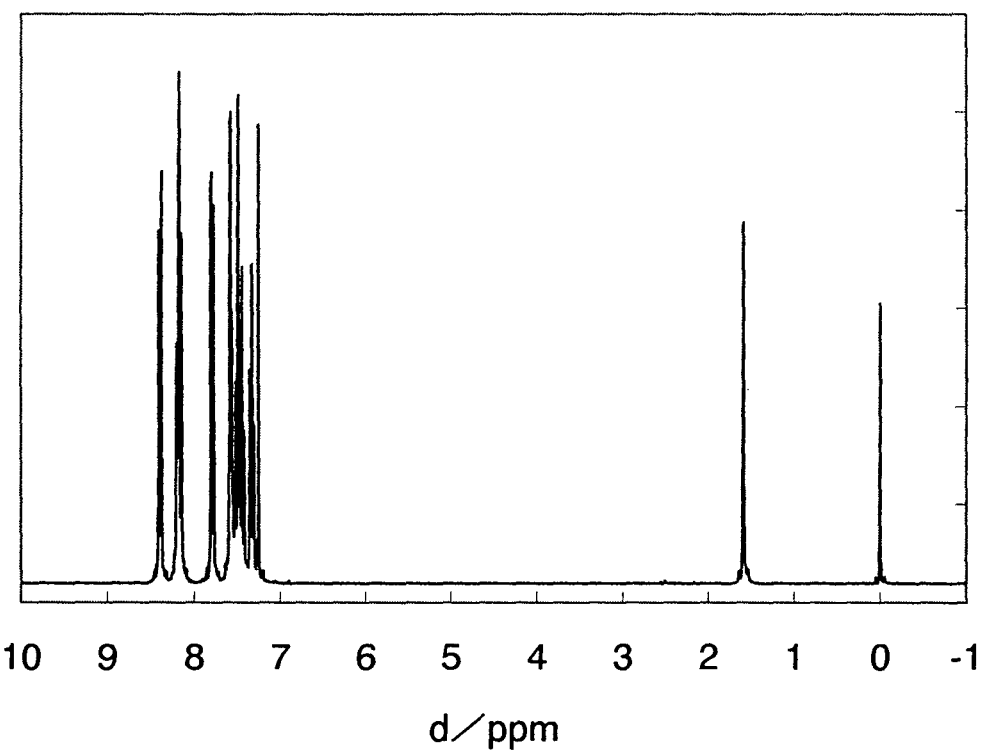
FIGS. 6A and 6B are graphs each showing an $^1$H NMR chart of an oxadiazole derivative CO11.
Figure 6B:
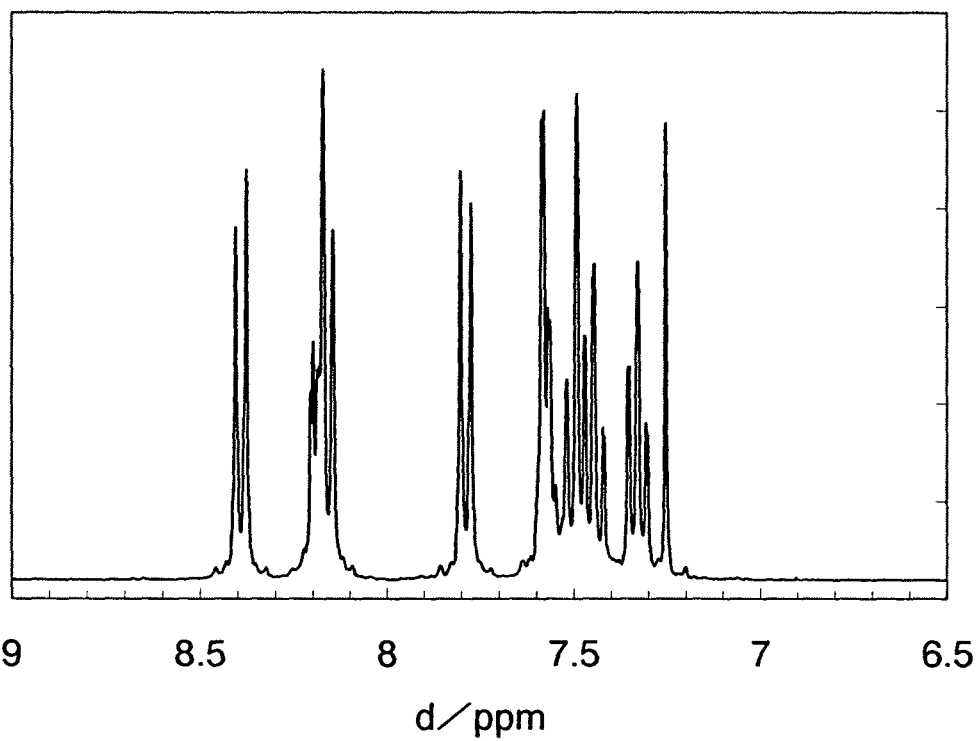

The following shows a result of analyzing the obtained CO11 by nuclear magnetic resonance spectroscopy ($^1$H NMR). FIG. 6A shows an $^1$H NMR chart and FIG. 6B shows an enlarged chart thereof. Accordingly, it was found that the oxadiazole derivative CO11 of the present invention represented by the structural formula (1) was obtained in Example 1.

$^1$H NMR (CDCl$_3$, 300 MHz,): δ=7.29-7.65 (m, 9H), δ=7.79 (d, J=8.3, 2H), δ=8.13-8.25 (m, 4H), δ=8.39 (d, J=8.3, 2H)

Figure 7A:
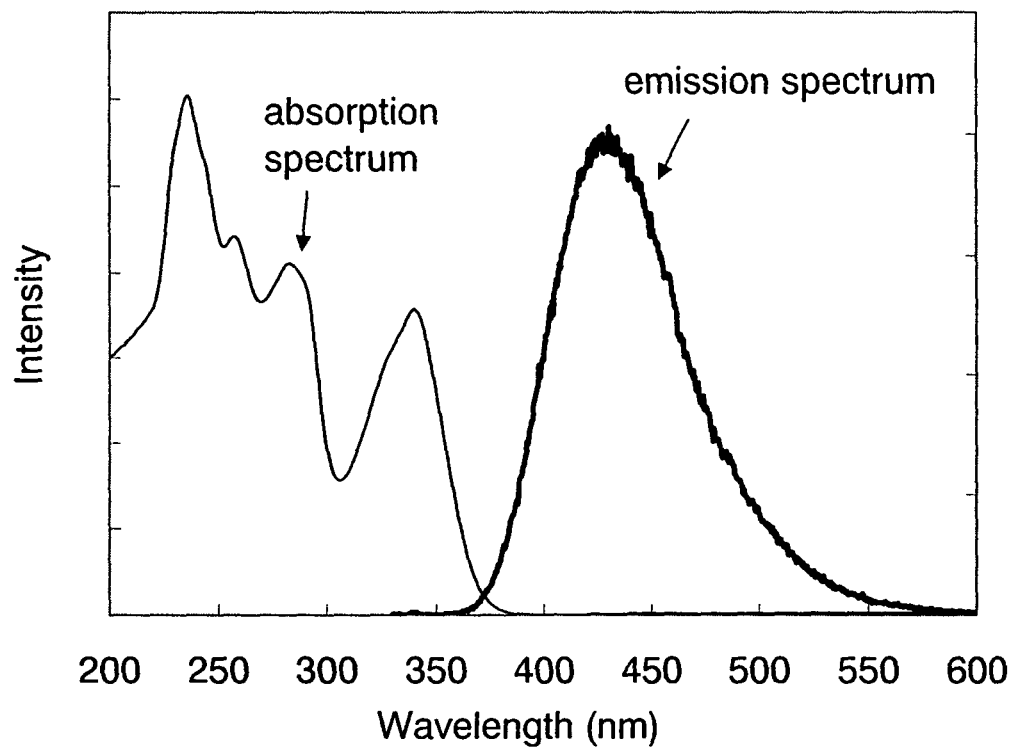
FIGS. 7A and 7B are graphs each showing an ultraviolet-visible spectrum and emission spectrum of an oxadiazole derivative CO11.
Figure 7B:
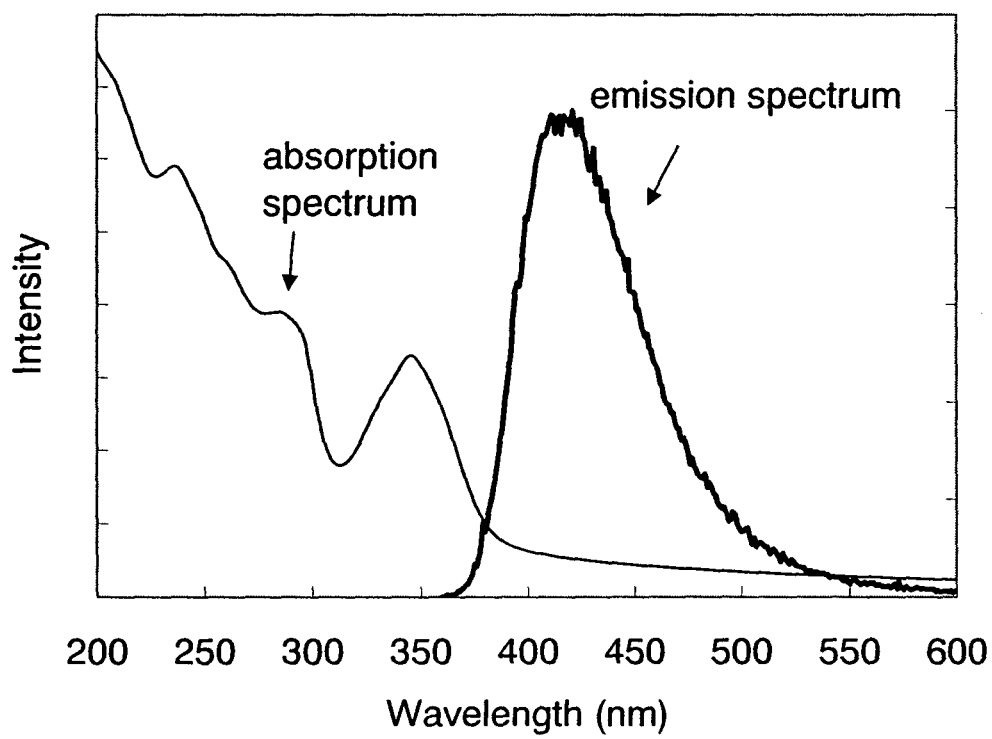

Next, the absorption spectrum and the emission spectrum of CO11 were measured. The absorption spectrum was measured using an ultraviolet-visible spectrophotometer (V-550, by JASCO Corporation) and the emission spectrum was measured using a spectrofluorometer (FS920, by Hamamatsu Photonics K.K.). The measurement was performed at room temperature for a dichloromethane solution and an evaporated film. FIG. 7A shows a measurement result for the dichloromethane solution and FIG. 7B shows a measurement result for the evaporated film. The horizontal axis indicates the wavelength and the perpendicular axis indicates the intensity of the absorption and light emission.

As shown in FIG. 7A, the CO11 of the present invention has an emission spectrum having a peak at 433 nm in the dichloromethane solution. Note that the emission spectrum was measured through excitation at a wavelength of 340 nm.

In addition, as shown in FIG. 7B, the evaporated film of CO11 has an emission spectrum having a peak at 421 nm. Note that the emission spectrum was measured through excitation at a wavelength of 346 nm.

Data on the absorption spectrum in FIG. 7B was used to obtain the absorption edge by a tauc plot. Further, the energy of the absorption edge was used as an energy gap to find that an energy gap of CO11 was 3.29 eV. Accordingly, it was found that the CO11 has high excitation energy.

EXAMPLE 2

Example 2 specifically exemplifies a manufacturing example of a light-emitting element of the present invention. FIG. 2 shows an element structure thereof.

<<Manufacturing of a Light-Emitting Element 1 of the Present Invention>>

First, a glass substrate with a thickness of 110 nm, over which indium tin oxide containing silicon oxide (ITSO) was formed, was prepared. The periphery of the ITSO surface was covered with an insulating film so that a surface of 2 mm×2 mm was exposed. Note that ITSO is a first electrode 201 serving as an anode of a light-emitting element. As pretreatment for forming a light-emitting element over the substrate, the surface of the substrate was cleaned with a porous resin brush, baked at 200° C. for 1 hour, and subjected to UV ozone treatment for 370 seconds.

Subsequently, the substrate was fixed to a holder provided in a vacuum evaporation apparatus so that the surface provided with ITSO faced downward.

After pressure in the vacuum evaporation apparatus was reduced to $10^{-4}$ Pa, NPB represented by the following structural formula (i) and molybdenum oxide(VI) were co-evaporated so as to satisfy NPB:molybdenum oxide(VI)=4:1 (mass ratio), whereby a hole injecting layer 211 was formed. A thickness thereof was set to be 50 nm. Note that a co-evaporation method is an evaporation method in which a plurality of different substances is concurrently vaporized from respective different evaporation sources. Next, YGAF represented by the following structural formula (ii) was evaporated to be 10 nm thick, whereby a hole transporting layer 212 was formed. Further, on the hole transporting layer 212, YGAO11 represented by the following structural formula (iii) and Ir(ppy)$_2$(acac) represented by the following structural formula (iv) were co-evaporated so as to satisfy YGAO11:Ir(ppy)$_2$(acac)=1:0.08 (mass ratio), whereby a first light-emitting layer 213 was formed. A thickness thereof was set to be 20 nm. Then, CO11 synthesized in Example 1 and Ir(ppy)$_2$(acac) were co-evaporated so as to satisfy CO11:Ir(ppy)$_2$(acac)=1:0.08 (mass ratio), whereby a second light-emitting layer 214 was formed. A thickness thereof was set to be 10 nm. Further, Alq$_3$ represented by the following structural formula (v) was evaporated to be 10 nm, whereby an electron transporting layer 215 was formed. Furthermore, on the electron transporting layer 215, Alq$_3$ and lithium (Li) were co-evaporated so as to satisfy Alq$_3$:Li=1:0.01 (mass ratio), whereby an electron injecting layer 216 was formed. A thickness thereof was set to be 20 nm. Finally, aluminum was formed to be 200 nm thick as a second electrode 202 serving as a cathode, and accordingly, a light-emitting element of the present invention was obtained. Note that, in the above evaporation process, all evaporation was performed by a resistance heating method.

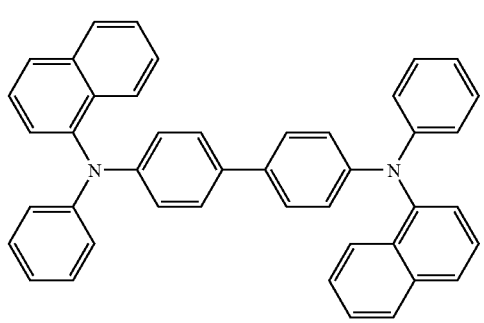

-continued

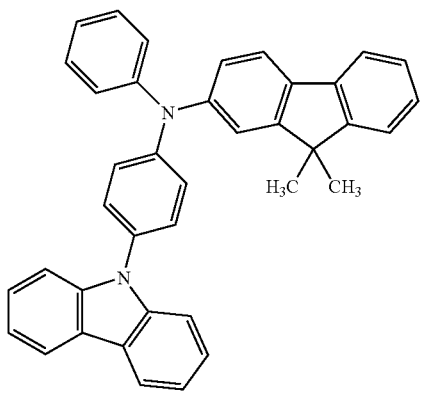

(ii)

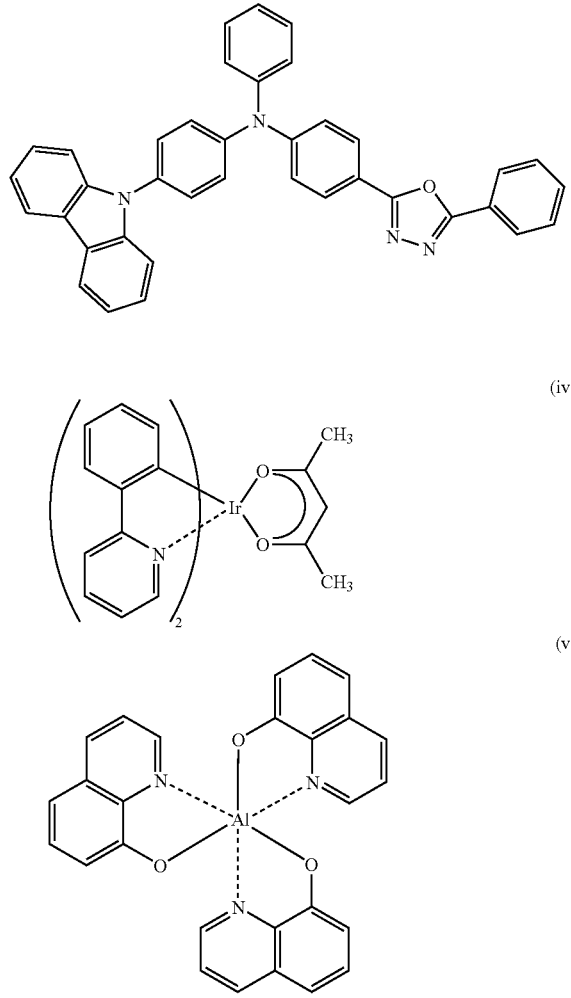

(iii)

(iv)

(v)

<<Manufacturing of a Comparative Light-Emitting Element 2>>

For comparison, a light-emitting element was manufactured in the similar manner to the above light-emitting element 1 except for a light-emitting layer to be shown below which was provided instead of the first light-emitting layer 213 and the second light-emitting layer 214. The light-emitting layer in the comparative light-emitting element 2 was formed to have a thickness of 30 nm by co-evaporation of YGAO11 and Ir(ppy)$_2$(acac) so as to satisfy YGAO11:Ir(ppy)$_2$(acac)=1:0.08 (mass ratio). That is, the element structure of the comparative light-emitting element 2 is as shown in FIG. 3A.

<<Manufacturing of a Comparative Light-Emitting Element 3>>

For comparison, a light-emitting element was manufactured in the similar manner to the above light-emitting element 1 except for a light-emitting layer to be shown below which was provided instead of the first light-emitting layer 213 and the second light-emitting layer 214. The light-emitting layer in the comparative light-emitting element 3 was formed to have a thickness of 30 nm by co-evaporation of CO11 and Ir(Ppy)$_2$(acac) so as to satisfy CO11:Ir(ppy)$_2$(acac)=1:0.08 (mass ratio). That is, the element structure of the comparative light-emitting element 3 is as shown in FIG. 3B.

<<Operation Characteristics of the Light-Emitting Element 1 of the Present Invention and the Comparative Light-Emitting Elements 2 and 3>>

After the light-emitting element 1 of the present invention and the comparative light-emitting elements 2 and 3 obtained as described above were sealed in a glove box with a nitrogen atmosphere so as not to expose the light-emitting elements to the air, operation characteristics of these light-emitting elements were measured. Note that the measurement was performed at room temperature (an atmosphere kept at 25° C.).

Figure 8A:
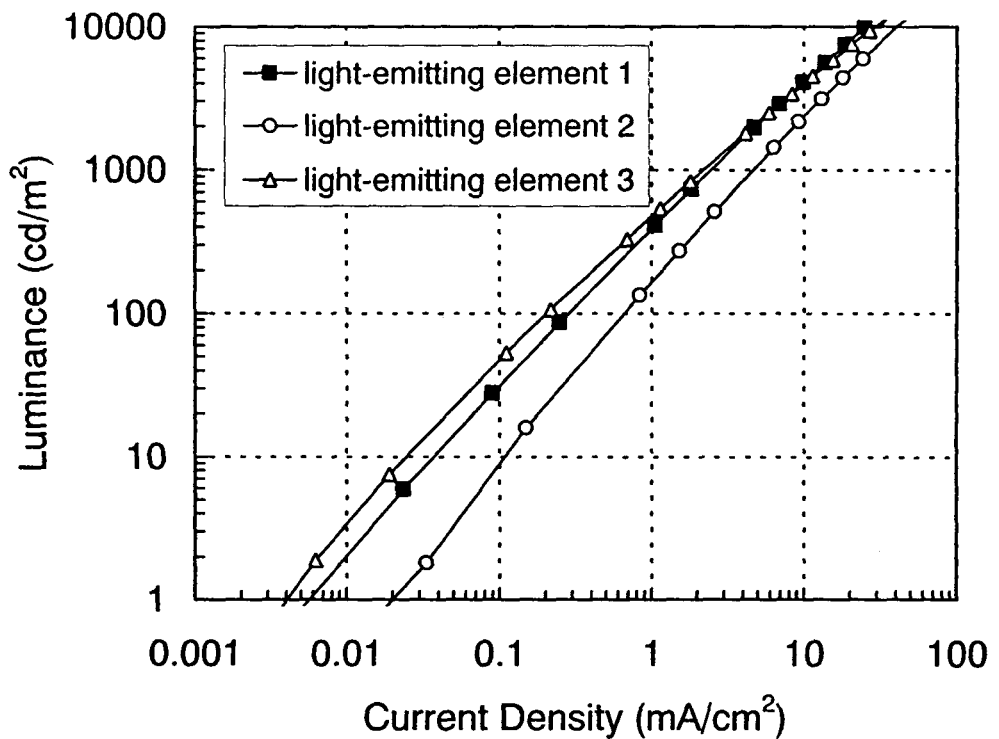
FIGS. 8A and 8B are views each showing operation characteristics of light-emitting elements manufactured in Example 2.
Figure 8B:
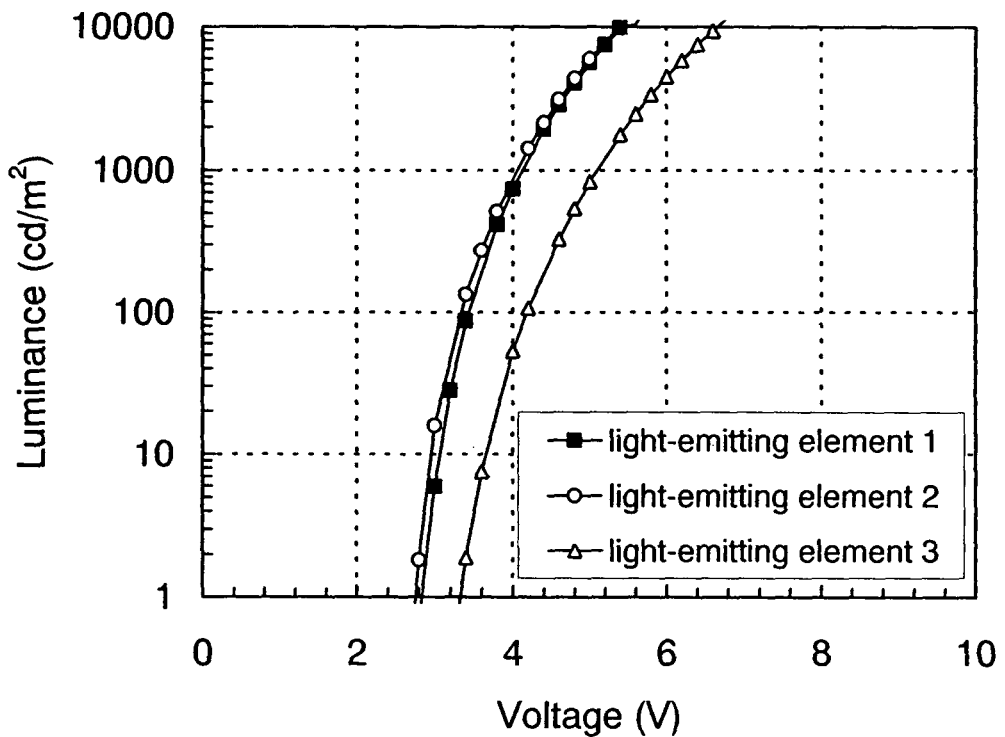
Figure 9:
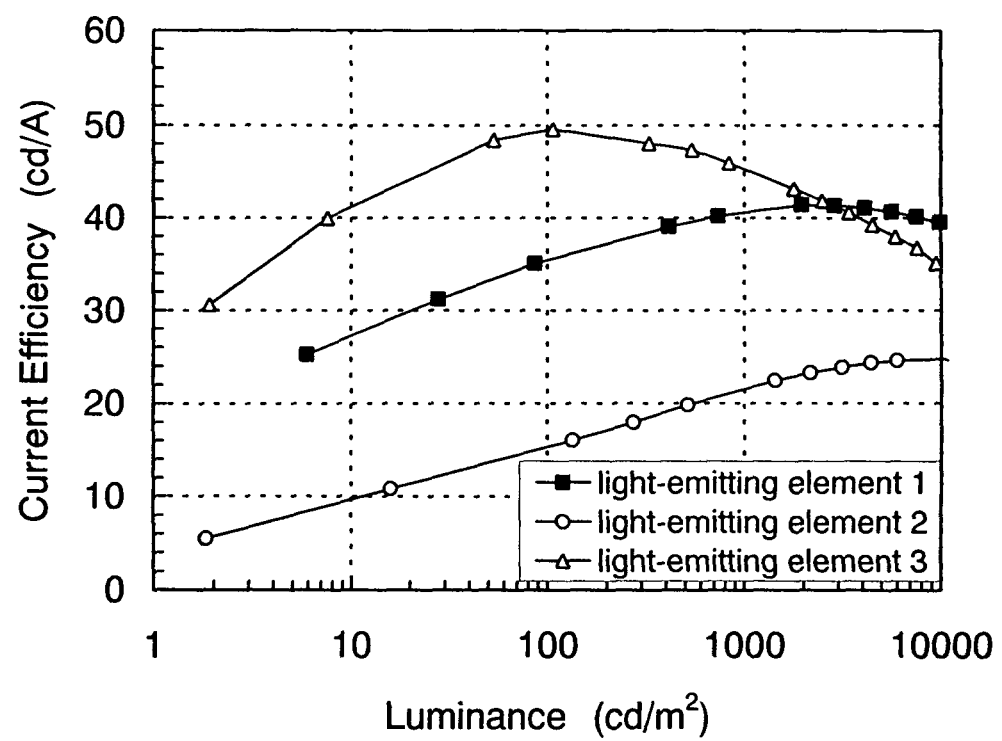
FIG. 9 is a view showing operation characteristics of light-emitting elements manufactured in Example 2.

FIG. 8A shows current density-luminance characteristics of the light-emitting element 1 of the present invention and the comparative light-emitting elements 2 and 3, and FIG. 8B shows voltage-luminance characteristics thereof. FIG. 9 shows luminance-current efficiency characteristics of these light-emitting elements. Current efficiency at 3000 cd/m$^2$ was 41.3 cd/A in the light-emitting-element 1 of the present invention, 23.9 cd/A in the comparative light-emitting element 2, and 41.1 cd/A in the comparative light-emitting element 3. CIE chromaticity coordinates of each light-emitting element at 3000 cd/m$^2$ were (x, y)=(0.35, 0.61) in the light-emitting element 1 of the present invention, (x, y)=(0.35, 0.61) in the comparative light-emitting element 2, and (x, y)=(0.34, 0.62) in the comparative light-emitting element 3. In each light-emitting element, emission of green light from Ir(ppy)$_2$(acac) that was a guest material was obtained.

Next, these elements were driven under the condition of fixed current density, setting initial luminance to be 3000 cd/m$^2$. The luminance half-decay period of the light-emitting element 1 was 17 hours, the luminance half-decay period of the comparative light-emitting element 2 was 18 hours, and the luminance half-decay period of the comparative light-emitting element 3 was 5 hours.

The results were summarized in Table 1 below. As shown in Table 1, when the light-emitting element 1 of the present invention and the comparative light-emitting element 2 are compared, it is found that the light-emitting element 1 of the present invention is superior in luminous efficiency though the elements have almost the same life. Further, when the light-emitting element 1 of the present invention and the comparative light-emitting element 3 are compared, it is found that the light-emitting element 1 of the present invention is superior in the life of the element though the elements have almost the same luminous efficiency.

TABLE 1

| | Element configuration | | | Current Efficiency [cd/A] @ 3000 cd/m$^2$ | Luminance half-decay period [h] @ 3000 cd/m$^2$ |
|---|---|---|---|---|---|
| | Hole transporting layer | Light-emitting layer (host + guest) | | Electron transporting layer | |
| Light-emitting element 1 | YGAF | First light-emitting layer YGAO11 + Ir(ppy)$_2$(acac) | Second light-emitting layer CO11 + Ir(ppy)$_2$(acac) | Alq$_3$ | 41.3 | 17 |
| Light-emitting element 2 | YGAF | YGAO11 + Ir(ppy)$_2$(acac) | | Alq$_3$ | 23.9 | 18 |
| Light-emitting element 3 | YGAF | CO11 + Ir(ppy)$_2$(acac) | | Alq$_3$ | 41.1 | 5 |

This will be explained below. First, YGAO11 used in the light-emitting element 1 and the comparative light-emitting element 2 has a comparatively higher hole transporting property than an electron transporting property; thus, the comparative light-emitting element 2 has a carrier recombination region around an interface between a light-emitting layer and an electron transporting layer. Here, it is reported that, while phosphorescence emission color of Ir(Ppy)$_2$(acac) that is a phosphorescent compound used in this example is green (emission wavelength is in the vicinity of 520 to 530 nm), phosphorescence emission color of Alq$_3$ used in the electron transporting layer is deep red (650 to 700 nm), and accordingly, Alq$_3$ has lower triplet excitation energy. Therefore, it is considered that quenching occurs by Alq$_3$, which leads to low luminous efficiency. On the other hand, in the light-emitting element 1 of the present invention, a carrier recombination region is formed in both of the first light-emitting layer and the second light-emitting layer, and accordingly, the light-emitting element 1 of the present invention is not easily affected by Alq$_3$. Conversely, Alq$_3$ that is known as a stable compound can be used, and both of luminous efficiency and the life of the element can be ensured.

On the other hand, CO11 used in the light-emitting element 1 and the comparative light-emitting element 3 has a higher electron transporting property than a hole transporting property; thus, the comparative light-emitting element 3 has a carrier recombination region around an interface between a light-emitting layer and a hole transporting layer. In Example 2, since triplet excitation energy of YGAF used in the hole transporting layer is high, high luminous efficiency can be obtained also in the comparative light-emitting element 3, similarly to the light-emitting element of the present invention. However, in a conventional structure like the comparative light-emitting element 3, the life of the element is drastically lowered. Although CO11 has an advantage that triplet excitation energy is high, it is considered that CO11 is slightly inferior in stability from the result of the comparative light-emitting element 3. On the other hand, in a structure like the light-emitting element 1, high luminous efficiency can be obtained at the same time as the life of the element can be prevented from being shortened.

As described above, it was found that both high luminous efficiency and long element life can be obtained by manufacture of the light-emitting element of the present invention. Therefore, by implementation of the present invention, a light-emitting element with high luminous efficiency and long life of the element can be obtained.

EXAMPLE 3

Example 3 specifically exemplifies a manufacturing example of a light-emitting element of the present invention. FIG. 2 shows an element structure thereof.

<<Manufacturing of a Light-Emitting Element 4 of the Present Invention>>

A light-emitting element 4 of the present invention was manufactured in the similar manner to the light-emitting element 1 in Example 2 except for NPB which was used instead of YGAF in the hole transporting layer 212.

<<Manufacturing of a Comparative Light-Emitting Element 5>>

For comparison, a comparative light-emitting element 5 was manufactured in the similar manner to the comparative light-emitting element 2 in Example 2 except for NPB which was used instead of YGAF in the hole transporting layer 212.

<<Manufacturing of a Comparative Light-Emitting Element 6>>

For comparison, a comparative light-emitting element 6 was manufactured in the similar manner to the comparative light-emitting element 3 in Example 2 except for NPB which was used instead of YGAF in the hole transporting layer 212.

<<Operation Characteristics of the Light-Emitting Element 4 of the Present Invention and the Comparative Light-Emitting Elements 5 and 6>>

After the light-emitting element 4 of the present invention and the comparative light-emitting elements 5 and 6 obtained as described above were sealed in a glove box with a nitrogen atmosphere so as not to expose the light-emitting elements to the air, operation characteristics of these light-emitting elements were measured. Note that the measurement was performed at room temperature (an atmosphere kept at 25° C.).

Figure 10A:
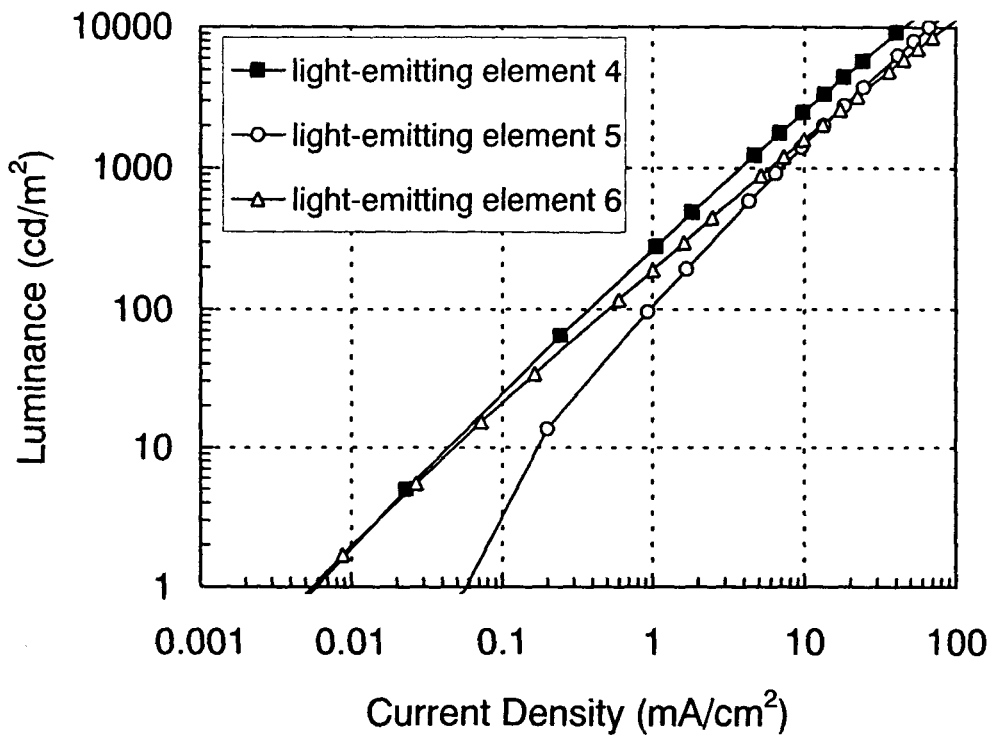
FIGS. 10A and 10B are views each showing operation characteristics of light-emitting elements manufactured in Example 3.
Figure 10B:
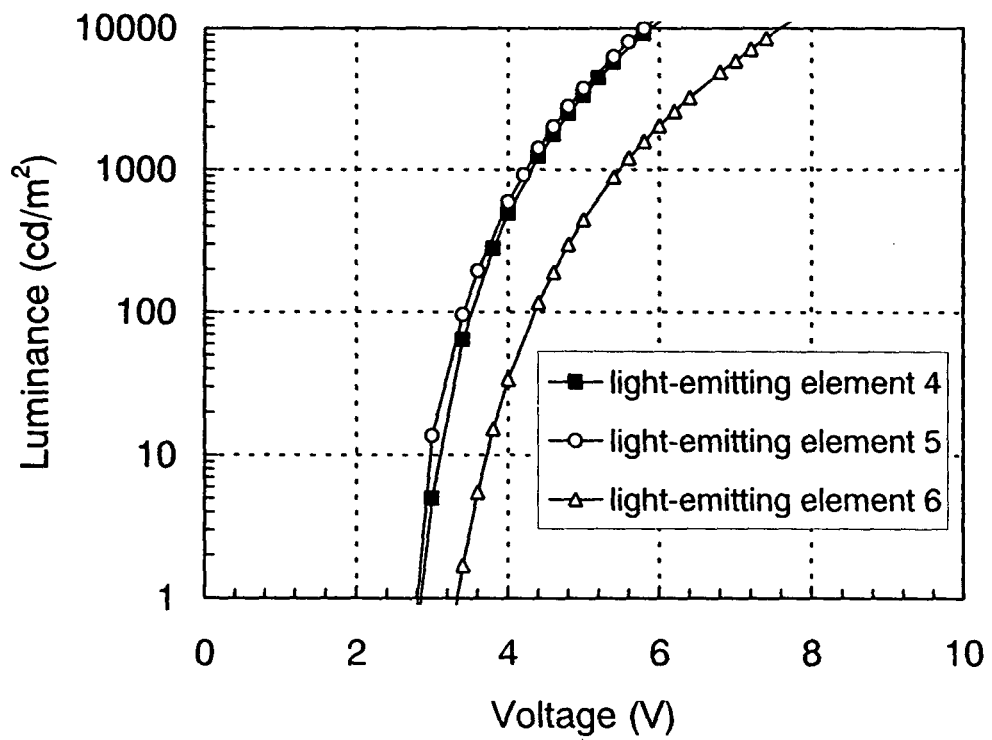
Figure 11:
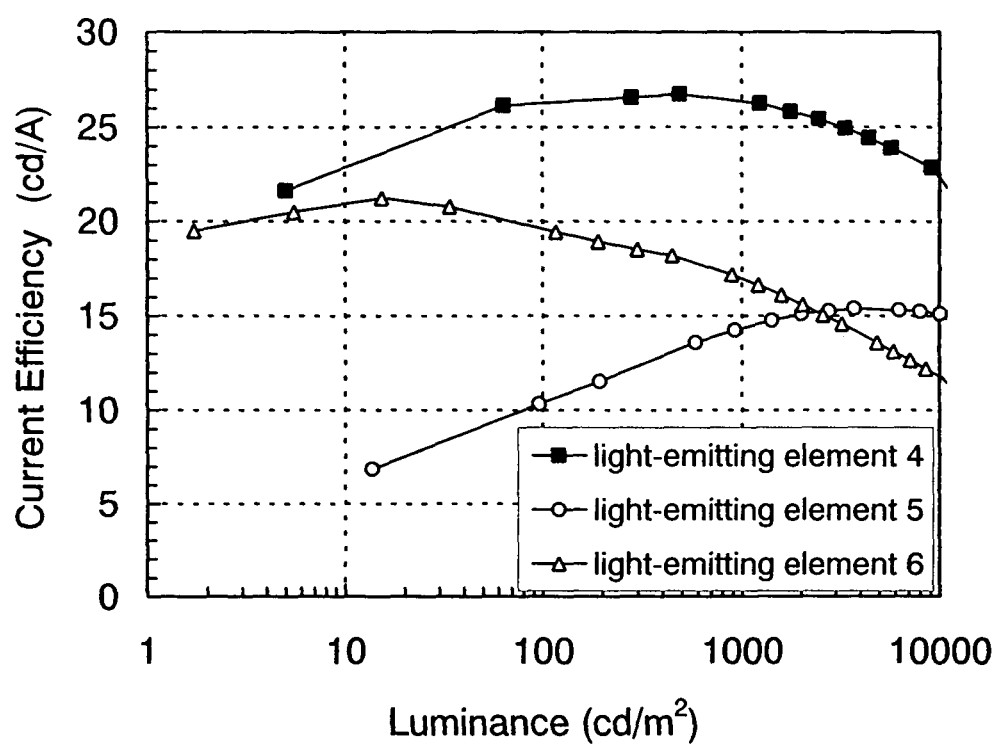
FIG. 11 is a view showing operation characteristics of light-emitting elements manufactured in Example 3.

FIG. 10A shows current density-luminance characteristics of the light-emitting element 4 of the present invention and the comparative light-emitting elements 5 and 6, and FIG. 10B shows voltage-luminance characteristics thereof. FIG. 11 shows luminance-current efficiency characteristics of these light-emitting elements. Current efficiency at 3000 cd/m$^2$ was 25.1 cd/A in the light-emitting-element 4 of the present invention, 15.3 cd/A in the comparative light-emitting element 5, and 14.7 cd/A in the comparative light-emitting element 6. CIE chromaticity coordinates of each light-emitting element at 3000 cd/m$^2$ were (x, y)=(0.35, 0.61) in the light-emitting element 4 of the present invention, (x, y)=(0.35, 0.61) in the comparative light-emitting element 5, and (x, y)=(0.34, 0.60) in the comparative light-emitting element 6. In each light-emitting element, emission of green light from Ir(ppy)$_2$(acac) that was a guest material was obtained.

The results were summarized in Table 2 below. As shown in Table 2, when the light-emitting element 4 of the present invention is compared with any of the comparative light-emitting element 5 and the comparative light-emitting element 6, it is found that the light-emitting element 4 of the present invention is superior in luminous efficiency.

TABLE 2

| | Element configuration | | | Current Efficiency [cd/A] @ 3000 cd/m$^2$ |
|---|---|---|---|---|
| | Hole transporting layer | Light-emitting layer (host + guest) | | Electron transporting layer | |
| Light-emitting element 4 | NPB | First light-emitting layer YGAO11 + Ir(ppy)$_2$(acac) | Second light-emitting layer CO11 + Ir(ppy)$_2$(acac) | Alq$_3$ | 25.1 |
| Light-emitting element 5 | NPB | YGAO11 + Ir(ppy)$_2$(acac) | | Alq$_3$ | 15.3 |
| Light-emitting element 6 | NPB | CO11 + Ir(ppy)$_2$(acac) | | Alq$_3$ | 14.7 |

This will be explained below. First, YGAO11 used in the light-emitting element 4 and the comparative light-emitting element 5 has a comparatively higher hole transporting property than an electron transporting property; thus, the comparative light-emitting element 5 has a carrier recombination region around an interface between a light-emitting layer and an electron transporting layer. Here, it is reported that, while phosphorescence emission color of Ir(ppy)$_2$(acac) that is a phosphorescent compound used in this example is green (emission wavelength is in the vicinity of 520 to 530 nm), phosphorescence emission color of Alq$_3$ used in the electron transporting layer is deep red (650 to 700 nm), and accordingly, Alq$_3$ has lower triplet excitation energy. Therefore, it is considered that quenching occurs by Alq$_3$, which leads to low luminous efficiency. On the other hand, in the light-emitting element 4 of the present invention, a carrier recombination region is formed in both of a first light-emitting layer and a second light-emitting layer, and accordingly, the light-emitting element 4 of the present invention is not easily affected by Alq$_3$. Conversely, Alq$_3$ that is known as a stable compound can be used, and both of luminous efficiency and the life of the element can be ensured.

On the other hand, CO11 used in the light-emitting element 4 and the comparative light-emitting element 6 has a higher electron transporting property than a hole transporting property; thus, the comparative light-emitting element 6 has a carrier recombination region around an interface between a light-emitting layer and a hole transporting layer. Here, while phosphorescence emission color of Ir(ppy)$_2$(acac) that is a phosphorescent compound used in this example is green (emission wavelength is in the vicinity of 520 to 530 nm), phosphorescence emission color of NPB used in the hole transporting layer is yellow (540 to 550 nm), and accordingly, NPB has lower triplet excitation energy. Therefore, it is considered that quenching occurs by NPB, which leads to low luminous efficiency. On the other hand, in the light-emitting element 4 of the present invention, a carrier recombination region is formed in both of the first light-emitting layer and the second light-emitting layer, and accordingly, the light-emitting element 4 of the present invention is not easily affected by NPB. Conversely, NPB that is known as a stable compound can be used, and both of luminous efficiency and the life of the element can be ensured.

As described above, it was found that high luminous efficiency can be obtained by manufacture of the light-emitting element of the present invention. In addition, it was found that a stable compound having lower triplet excitation energy than Ir(ppy)$_2$(acac) that is a phosphorescent compound can be used for a hole transporting layer and an electron transporting layer. Therefore, by implementation of the present invention, a light-emitting element with high luminous efficiency and long life can be obtained.

EXAMPLE 4

Example 4 specifically exemplifies a manufacturing example of a light-emitting element of the present invention. FIG. 2 shows an element structure thereof.

<<Manufacturing of a Light-Emitting Element 7 of the Present Invention>>

A glass substrate with a thickness of 110 nm, over which indium tin oxide containing silicon oxide (ITSO) was formed, was prepared. The periphery of the ITSO surface was covered with an insulating film so that a surface of 2 mm×2 mm was exposed. Note that ITSO is a first electrode 201 serving as an anode of a light-emitting element. As pretreatment for forming a light-emitting element over the substrate, the surface of the substrate was cleaned with a porous resin brush, baked at 200° C. for 1 hour, and subjected to UV ozone treatment for 370 seconds.

Subsequently, the substrate was fixed to a holder provided in a vacuum evaporation apparatus so that the surface provided with ITSO faced downward.

After pressure in the vacuum evaporation apparatus was reduced to $10^{-4}$ Pa, NPB and molybdenum oxide(VI) were co-evaporated so as to satisfy NPB:molybdenum oxide(VI)=4:1 (mass ratio), whereby a hole injecting layer 211 was formed. A thickness thereof was set to be 50 nm. Note that a co-evaporation method is an evaporation method in which a plurality of different substances is concurrently vaporized from respective different evaporation sources. Next, NPB was evaporated to be 10 nm thick, whereby a hole transporting layer 212 was formed. Further, on the hole transporting layer 212, YGAF and Ir(ppy)$_2$(acac) were co-evaporated so as to satisfy YGAF:Ir(ppy)$_2$(acac)=1:0.08 (mass ratio), whereby a first light-emitting layer 213 was formed. A thickness thereof was set to be 30 nm. Then, CO11 synthesized in Example 1 and Ir(ppy)$_2$(acac) were co-evaporated so as to satisfy CO11:Ir(ppy)$_2$(acac)=1:0.08 (mass ratio), whereby a second light-emitting layer 214 was formed. A thickness thereof was set to be 10 nm. Further, Alq$_3$ was evaporated to be 10 nm, whereby an electron transporting layer 215 was formed. Furthermore, on the electron transporting layer 215, Alq$_3$ and lithium (Li) were co-evaporated so as to satisfy Alq$_3$:Li=1:0.01 (mass ratio), whereby an electron injecting layer 216 was formed. A thickness thereof was set to be 20 nm. Finally, aluminum was formed to be 200 nm thick as a second electrode 202 serving as a cathode, whereby a light-emitting element of the present invention was obtained. Note that, in the above evaporation process, all evaporation was performed by a resistance heating method.

<<Manufacturing of a Comparative Light-Emitting Element 8>>

For comparison, a comparative light-emitting element 8 was manufactured in the similar manner to the above-described light-emitting element 7 except for a light-emitting layer to be shown below instead of the first light-emitting layer 213 and the second light-emitting layer 214. The light-emitting layer in the comparative light-emitting element 8 was formed to have a thickness of 30 nm by co-evaporation of YGAF and Ir(ppy)$_2$(acac) so as to satisfy YGAF:Ir(ppy)$_2$(acac)=1:0.08 (mass ratio). That is, the element structure of the comparative light-emitting element 8 is as shown in FIG. 3A.

<<Operation Characteristics of the Light-Emitting Element 7 of the Present Invention and the Comparative Light-Emitting Element 8>>

After the light-emitting element 7 of the present invention and the comparative light-emitting element 8 obtained as described above were sealed in a glove box with a nitrogen atmosphere so as not to expose the light-emitting elements to the air, operation characteristics of these light-emitting elements were measured. Note that the measurement was performed at room temperature (an atmosphere kept at 25° C.).

Figure 12A:
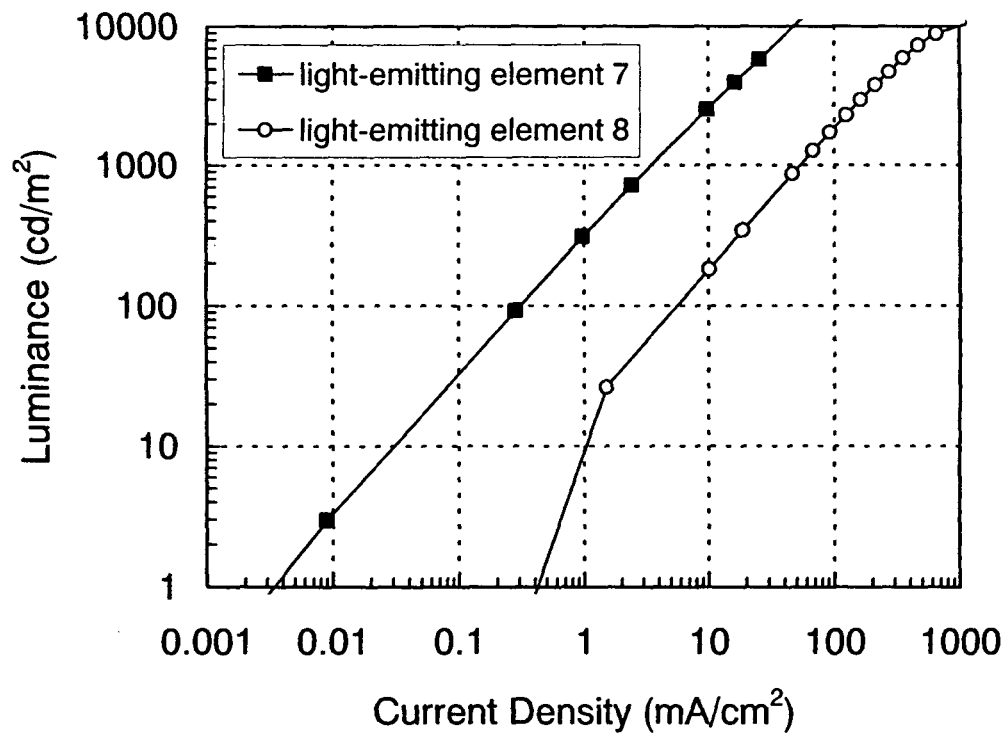
FIGS. 12A and 12B are views each showing operation characteristics of light-emitting elements manufactured in Example 4.
Figure 12B:
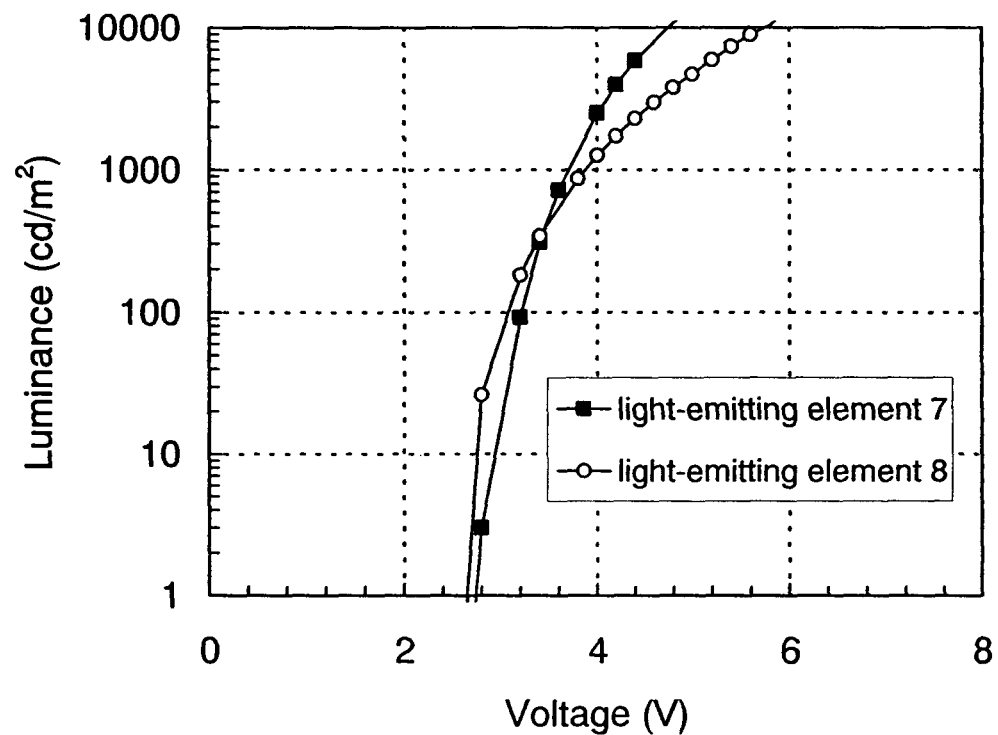
Figure 13:
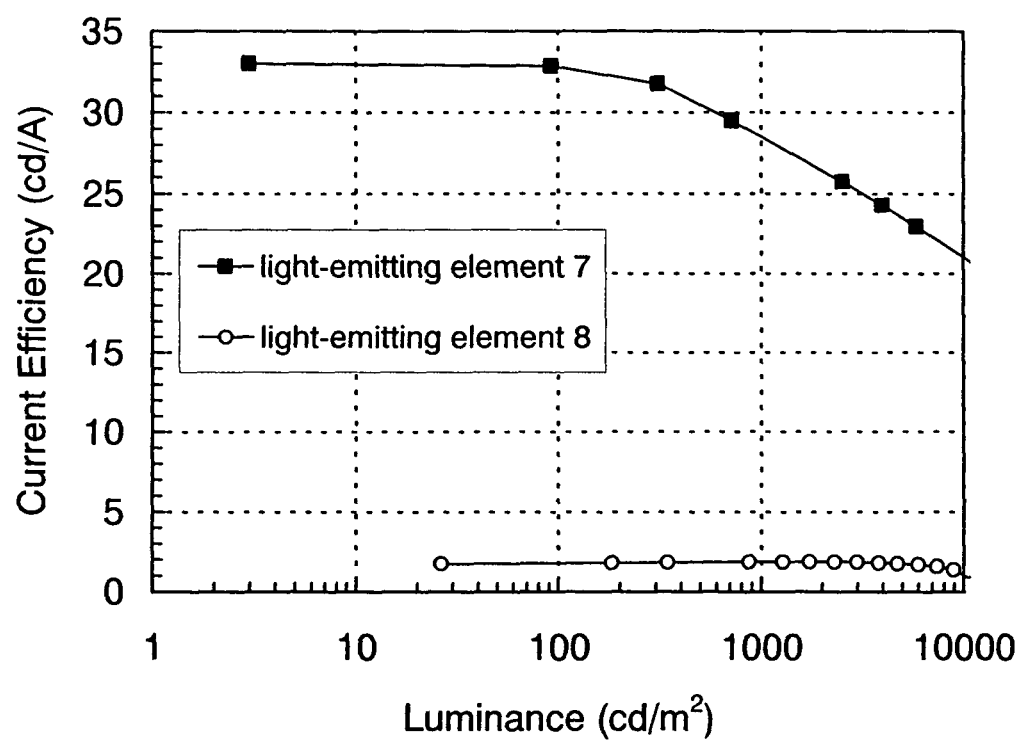
FIG. 13 is a view showing operation characteristics of light-emitting elements manufactured in Example 4.

FIG. 12A shows current density-luminance characteristics of the light-emitting element 7 of the present invention and the comparative light-emitting element 8, and FIG. 12B shows voltage-luminance characteristics thereof. FIG. 13 shows luminance-current efficiency characteristics of these light-emitting elements. Current efficiency at 3000 cd/m$^2$ was 25.2 cd/A in the light-emitting-element 7 of the present invention, and 1.8 cd/A in the comparative light-emitting element 8. CIE chromaticity coordinates of each light-emitting element at 3000 cd/m$^2$ were (x, y)=(0.33, 0.63) in the light-emitting element 7 of the present invention and (x, y)=(0.34, 0.57) in the comparative light-emitting element 8, where a value of a y coordinate was lowered. In the light-emitting element 7 of the present invention, emission of green light from Ir(ppy)$_2$(acac) that was a guest material was obtained. However, in the comparative light-emitting element 8, light emission considered to be derived from Alq$_3$ that was an electron transporting layer is observed. It is considered that a value of a y coordinate is lowered as a result thereof.

The results were summarized in Table 3 below. As shown in Table 3, when the light-emitting element 7 of the present invention is compared with the comparative light-emitting element 8, it is found that luminous efficiency of the comparative light-emitting element 8 is drastically lowered as compared with the light-emitting element 7 of the present invention.

This will be explained below. First, YGAF used in the light-emitting element 7 and the comparative light-emitting element 8 has an extremely higher hole transporting property than an electron transporting property; thus, in the comparative light-emitting element 8, holes penetrate the electron transporting layer. Therefore, it is considered that the comparative light-emitting element 8 has drastically low luminous efficiency since carrier balance is also disrupted as well as being affected by quenching occuring by Alq$_3$ as described in Example 2. On the other hand, in the light-emitting element 7 of the present invention, a carrier recombination region is formed in both of the first light-emitting layer and the second light-emitting layer, and accordingly, the light-emitting element 4 of the present invention is not easily affected by Alq$_3$. Conversely, Alq$_3$ that is known as a stable compound can be used, and both of luminous efficiency and the life of the element can be ensured.

As described above, it was found that high luminous efficiency can be obtained by manufacture of the light-emitting element of the present invention. In addition, it was found that a stable compound, such as NPB or Alq$_3$, having lower triplet excitation energy than Ir(ppy)$_2$(acac) that is a phosphorescent compound can be used for the hole transporting layer and the electron transporting layer. Therefore, by implementation of the present invention, a light-emitting element with high luminous efficiency and long life can be obtained.

EXAMPLE 5

Example 5 specifically exemplifies a manufacturing example of a light-emitting element of the present invention. FIG. 2 shows an element structure thereof.

<<Manufacturing of a Light-Emitting Element 9 of the Present Invention>>

A glass substrate with a thickness of 110 nm, over which indium tin oxide containing silicon oxide (ITSO) was formed, was prepared. The periphery of the ITSO surface was covered with an insulating film so that a surface of 2 mm×2 mm was exposed. Note that ITSO is a first electrode 201 serving as an anode of a light-emitting element. As pretreatment for forming a light-emitting element over the substrate, the surface of the substrate was cleaned with a porous resin brush, baked at 200° C. for 1 hour, and subjected to UV ozone treatment for 370 seconds.

Subsequently, the substrate was fixed to a holder provided in a vacuum evaporation apparatus so that the surface provided with ITSO faced downward.

After pressure in the vacuum evaporation apparatus was reduced to 10$^{-4}$ Pa, NPB represented by the structural formula (i) and molybdenum oxide(VI) were co-evaporated so as to satisfy NPB:molybdenum oxide(VI)=4:1 (mass ratio), whereby a hole injecting layer 211 was formed. A thickness thereof was set to be 50 nm. Note that a co-evaporation

TABLE 3

| | Element configuration | | | | Current Efficiency [cd/A] @ 3000 cd/m$^2$ |
|---|---|---|---|---|---|
| | Hole transporting layer | Light-emitting layer (host + guest) | | Electron transporting layer | |
| Light-emitting element 7 | NPB | First light-emitting layer YGAF + Ir(ppy)$_2$(acac) | Second light-emitting layer CO11 + Ir(ppy)$_2$(acac) | Alq$_3$ | 25.2 |
| Light-emitting element 8 | NPB | YGAF + Ir(ppy)$_2$(acac) | | Alq$_3$ | 1.8 | method is an evaporation method in which a plurality of different substances is concurrently vaporized from respective different evaporation sources. Next, NPB was evaporated to be 10 nm thick, whereby a hole transporting layer 212 was formed. Further, on the hole transporting layer 212, 2-{N-[4-(N-carbazolyl)phenyl]N-phenylamino]-spiro-9,9'-bifluorene (abbreviation: YGASF) represented by the structural formula (vi) and Ir(ppy)$_2$(acac) were co-evaporated so as to satisfy YGASF:Ir(ppy)$_2$(acac)=1:0.06 (mass ratio), whereby a first light-emitting layer 213 was formed. A thickness thereof was set to be 10 nm. Then, bis[2-(2-hydroxyphenyl)benzoxazolate]zinc(II) (abbreviation: Zn(PBO)$_2$) represented by the structural formula (vii) and Ir(ppy)$_2$(acac) were co-evaporated so as to satisfy Zn(PBO)$_2$:Ir(ppy)$_2$(acac)=1:0.06 (mass ratio), whereby a second light-emitting layer 214 was formed. A thickness thereof was set to be 30 nm. Note that an energy gap of Zn(PBO)$_2$ was 2.96 eV. Further, BAlq represented by the structural formula (viii) was evaporated to be 10 nm, whereby an electron transporting layer 215 was formed. Furthermore, on the electron transporting layer 215, Alq$_3$ and lithium (Li) were co-evaporated so as to satisfy Alq$_3$:Li=1:0.01 (mass ratio), whereby an electron injecting layer 216 was formed. A thickness thereof was set to be 20 nm. Finally, aluminum was formed to be 200 nm thick as a second electrode 202 serving as a cathode, whereby a light-emitting element of the present invention was obtained. Note that, in the above evaporation process, all evaporation was performed by a resistance heating method.

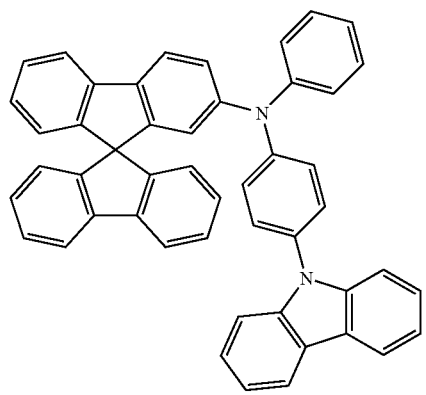

(vi)

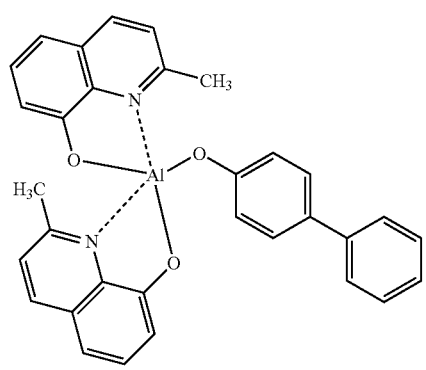

(vii)

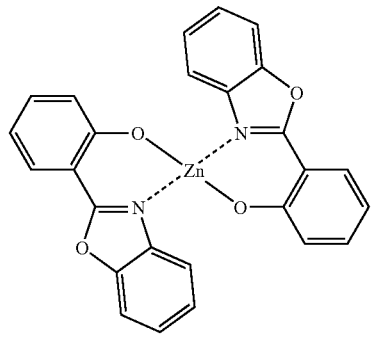

(viii)

<<Manufacturing of a Comparative Light-Emitting Element 10>>

For comparison, a comparative light-emitting element 10 was manufactured in the similar manner to the above-described light-emitting element 9 except for a light-emitting layer to be shown below which was provided instead of the first light-emitting layer 213 and the second light-emitting layer 214. The light-emitting layer in the comparative light-emitting element 10 was formed to have a thickness of 40 nm by co-evaporation of Zn(PBO)$_2$ and Ir(ppy)$_2$(acac) so as to satisfy Zn(PBO)$_2$:Ir(ppy)$_2$(acac)=1:0.06 (mass ratio). That is, the element structure of the comparative light-emitting element 10 is as shown in FIG. 3B.

<<Operation Characteristics of the Light-Emitting Element 9 of the Present Invention and the Comparative Light-Emitting Element 10>>

After the light-emitting element 9 of the present invention and the comparative light-emitting element 10 obtained as described above were sealed in a glove box with a nitrogen atmosphere so as not to expose the light-emitting elements to the air, operation characteristics of these light-emitting elements were measured. Note that the measurement was performed at room temperature (an atmosphere kept at 25° C.).

Figure 14A:
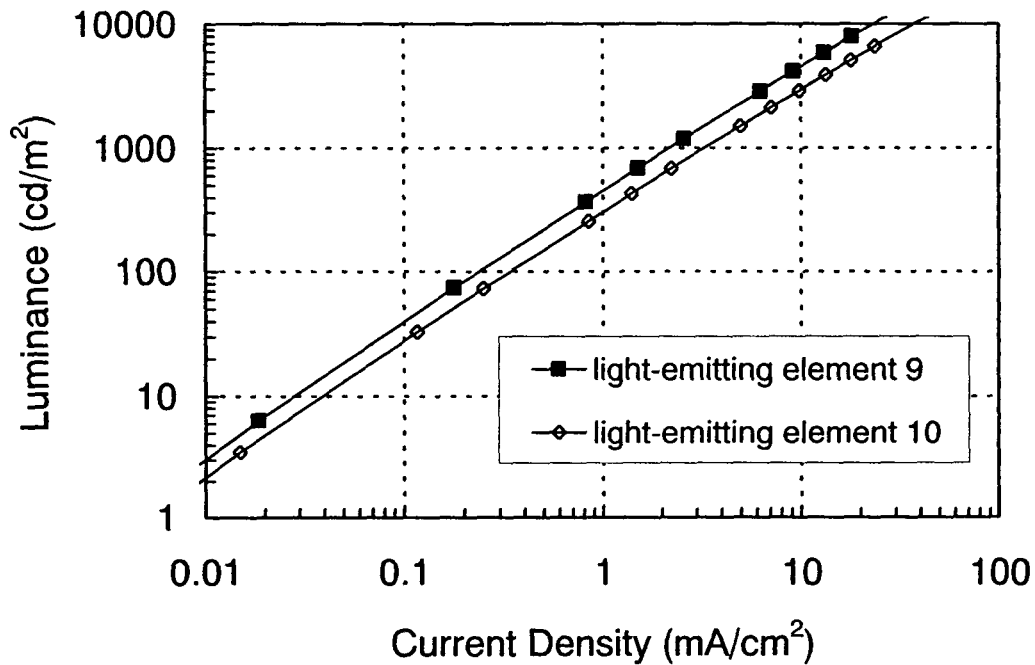
FIGS. 14A and 14B are views each showing operation characteristics of light-emitting elements manufactured in Example 6.
Figure 14B:
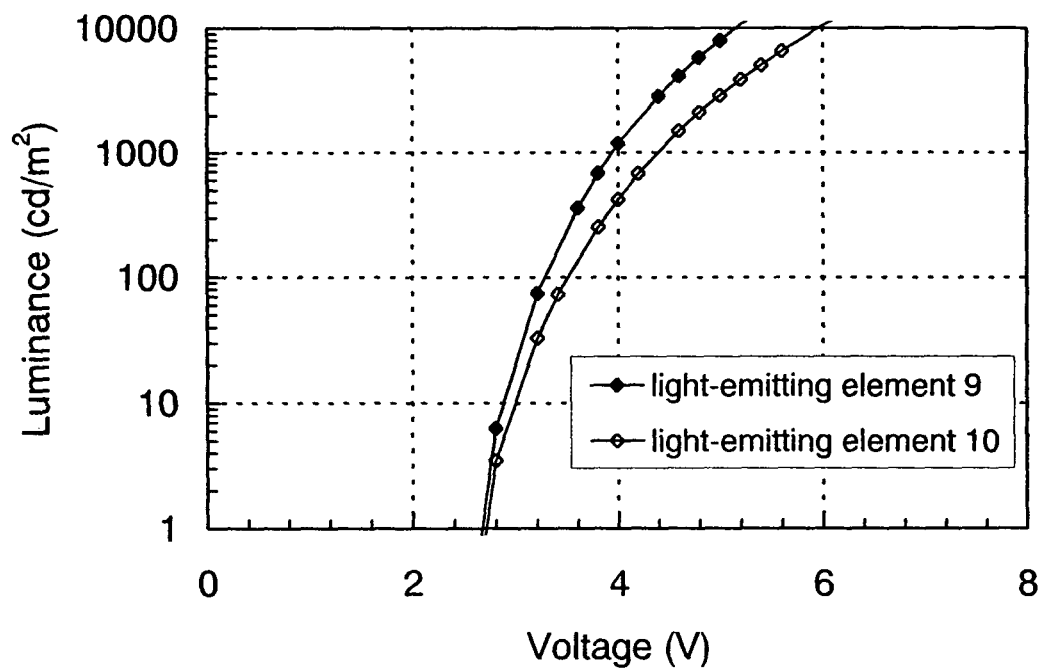
Figure 15:
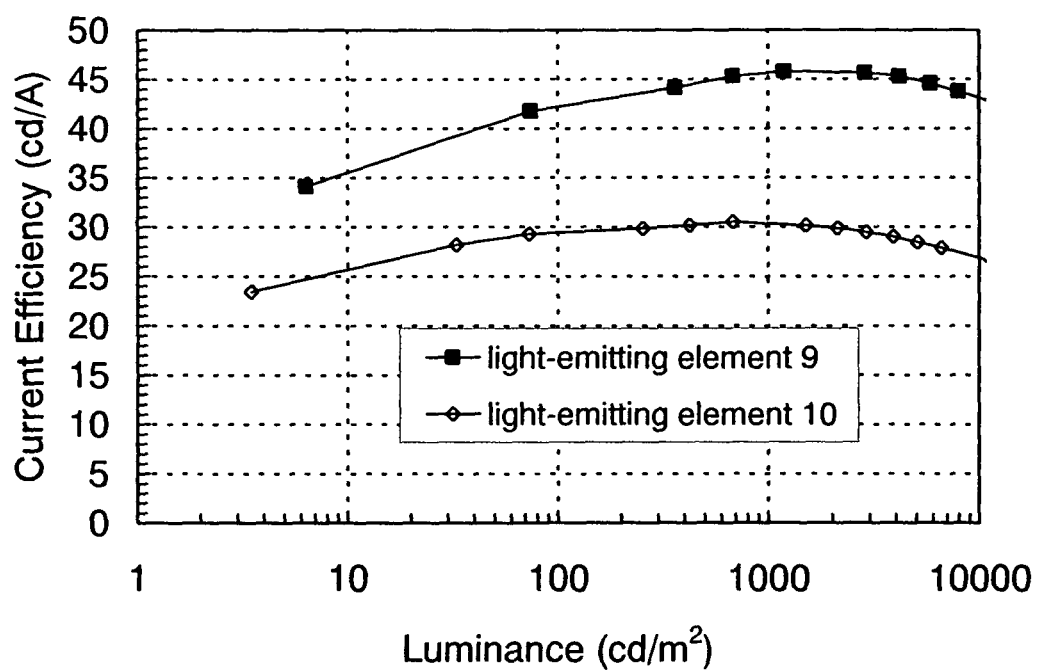
FIG. 15 is a view showing operation characteristics of light-emitting elements manufactured in Example 6.

FIG. 14A shows current density-luminance characteristics of the light-emitting element 9 of the present invention and the comparative light-emitting element 10, and FIG. 14B shows voltage-luminance characteristics thereof. FIG. 15 shows luminance-current efficiency characteristics of these light-emitting elements. Current efficiency at 3000 cd/m$^2$ was 45.6 cd/A in the light-emitting-element 9 of the present invention, and 29.4 cd/A in the comparative light-emitting element 10. CIE chromaticity coordinates of each light-emitting element at 3000 cd/m$^2$ were (x, y)=(0.35, 0.62) in the light-emitting element 9 of the present invention and (x, y)=(0.35, 0.62) in the comparative light-emitting element 9. In the light-emitting element 9 of the present invention and the comparative light-emitting element 10, emission of green light from Ir(ppy)$_2$(acac) that was a guest material was obtained.

The results were summarized in Table 4 below. As shown in Table 4, when the light-emitting element 9 of the present invention is compared with the comparative light-emitting element 10, it is found that luminous efficiency of the comparative light-emitting element 10 is drastically lowered as compared with the light-emitting element 9 of the present invention.

TABLE 4

| | Element configuration | | | | Current Efficiency [cd/A] @ 3000 cd/m² |
|---|---|---|---|---|---|
| | Hole transporting layer | Light-emitting layer (host + guest) | | Electron transporting layer | |
| Light-emitting element 9 | NPB | First light-emitting layer YGASF + Ir(ppy)₂(acac) | Second light-emitting layer Zn(PBO)₂ + Ir(ppy)₂(acac) | BAlq | 45. |
| Light-emitting element 10 | NPB | Zn(PBO)₂ + Ir(ppy)₂(acac) | | BAlq | 29.4 |

As described above, it was found that high luminous efficiency can be obtained by manufacture of the light-emitting element of the present invention. In addition, it was found that a stable compound, such as NPB or Alq$_3$, having lower triplet excitation energy than Ir(ppy)$_2$(acac) that is a phosphorescent compound can be used for the hole transporting layer and the electron transporting layer. Therefore, by implementation of the present invention, a light-emitting element with high luminous efficiency and long life can be obtained.

EXAMPLE 6

Example 6 specifically exemplifies a manufacturing example of a light-emitting element of the present invention. FIG. 2 shows an element structure thereof.

<<Manufacturing of a Light-Emitting Element 11 of the Present Invention>>

A glass substrate with a thickness of 110 nm, over which indium tin oxide containing silicon oxide (ITSO) was formed, was prepared. The periphery of the ITSO surface was covered with an insulating film so that a surface of 2 mm×2 mm was exposed. Note that ITSO is a first electrode 201 serving as an anode of a light-emitting element. As pretreatment for forming a light-emitting element over the substrate, the surface of the substrate was cleaned with a porous resin brush, baked at 200° C. for 1 hour, and subjected to UV ozone treatment for 370 seconds.

Subsequently, the substrate was fixed to a holder provided in a vacuum evaporation apparatus so that the surface provided with ITSO faced downward.

After pressure in the vacuum evaporation apparatus was reduced to 10$^{-4}$ Pa, NPB and molybdenum oxide(VI) were co-evaporated so as to satisfy NPB:molybdenum oxide(VI)=4:1 (mass ratio), whereby a hole injecting layer 211 was formed. A thickness thereof was set to be 50 nm. Note that a co-evaporation method is an evaporation method in which a plurality of different substances is concurrently vaporized from respective different evaporation sources. Next, NPB was evaporated to be 10 nm thick, whereby a hole transporting layer 212 was formed. Further, on the hole transporting layer 212, YGASF and Ir(ppy)$_2$(acac) were co-evaporated so as to satisfy YGASF:Ir(ppy)$_2$(acac)=1:0.06 (mass ratio), whereby a first light-emitting layer 213 was formed. A thickness thereof was set to be 10 nm. Then, bis [2-(2-hydroxyphenyl)-1-phenyl-1H-benzimidazolato]zinc(II) (abbreviation: Zn(BIZ)$_2$) represented by the structural formula (ix) and Ir(ppy)$_2$(acac) were co-evaporated so as to satisfy Zn(BIZ)$_2$: Ir(ppy)$_2$(acac)=1:0.06 (mass ratio), whereby a second light-emitting layer 214 was formed. A thickness thereof was set to be 30 nm. Note that an energy gap of Zn(BIZ)$_2$ was 3.05 eV. Zn(BIZ)$_2$ serves as an electron transporting host material. Further, BAlq was evaporated to be 10 nm, whereby an electron transporting layer 215 was formed. Furthermore, on the electron transporting layer 215, Alq$_3$ and lithium (Li) were co-evaporated so as to satisfy Alq$_3$:Li=1:0.01 (mass ratio), whereby an electron injecting layer 216 was formed. A thickness thereof was set to be 20 nm. Finally, aluminum was formed to be 200 nm thick as a second electrode 202 serving as a cathode, whereby a light-emitting element of the present invention was obtained. Note that, in the above evaporation process, all evaporation was performed by a resistance heating method.

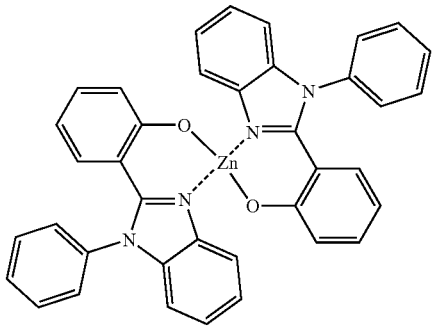

(ix)

<<Manufacturing of a Comparative Light-Emitting Element 12>>

For comparison, a comparative light-emitting element 12 was manufactured in the similar manner to the above-described light-emitting element 11 except for a light-emitting layer to be shown below which was provided instead of the first light-emitting layer 213 and the second light-emitting layer 214. The light-emitting layer in the comparative light-emitting element 12 was formed to have a thickness of 40 nm by co-evaporation of Zn(BIZ)$_2$ and Ir(ppy)$_2$(acac) so as to satisfy Zn(BIZ)$_2$:Ir(ppy)$_2$(acac)=1:0.06 (mass ratio). That is, the element structure of the comparative light-emitting element 12 is as shown in FIG. 3B.

<<Operation Characteristics of the Light-Emitting Element 11 of the Present Invention and the Comparative Light-Emitting Element 12>>

After the light-emitting element 11 of the present invention and the comparative light-emitting element 12 obtained as described above were sealed in a glove box with a nitrogen atmosphere so as not to expose the light-emitting elements to the air, operation characteristics of these light-emitting elements were measured. Note that the measurement was performed at room temperature (an atmosphere kept at 25° C.).

Figure 16A:
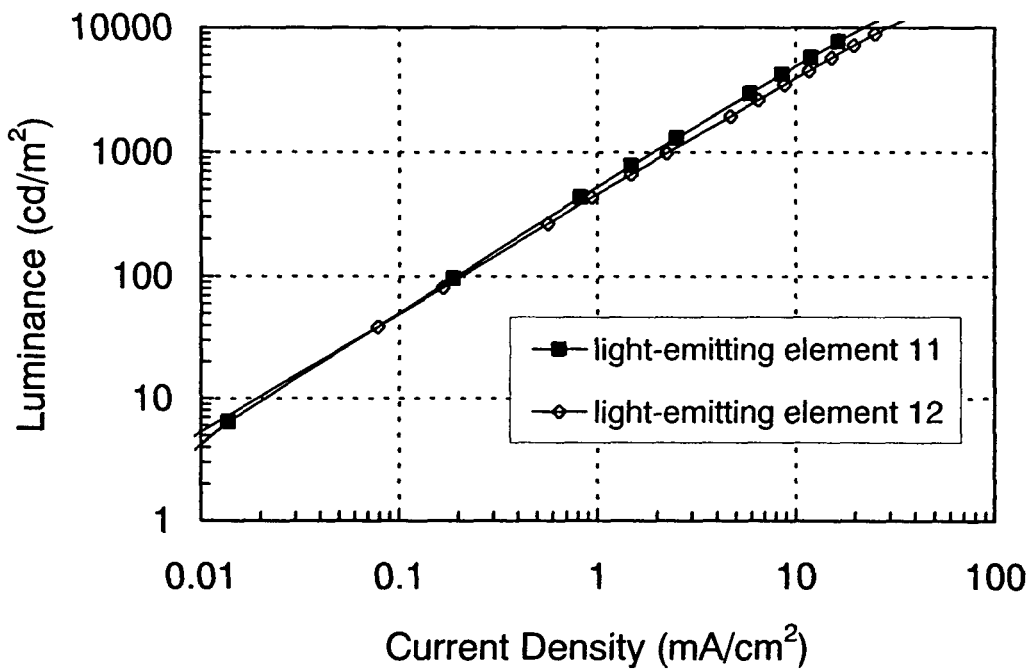
FIGS. 16A and 16B are views each showing operation characteristics of light-emitting elements manufactured in Example 7.
Figure 16B:
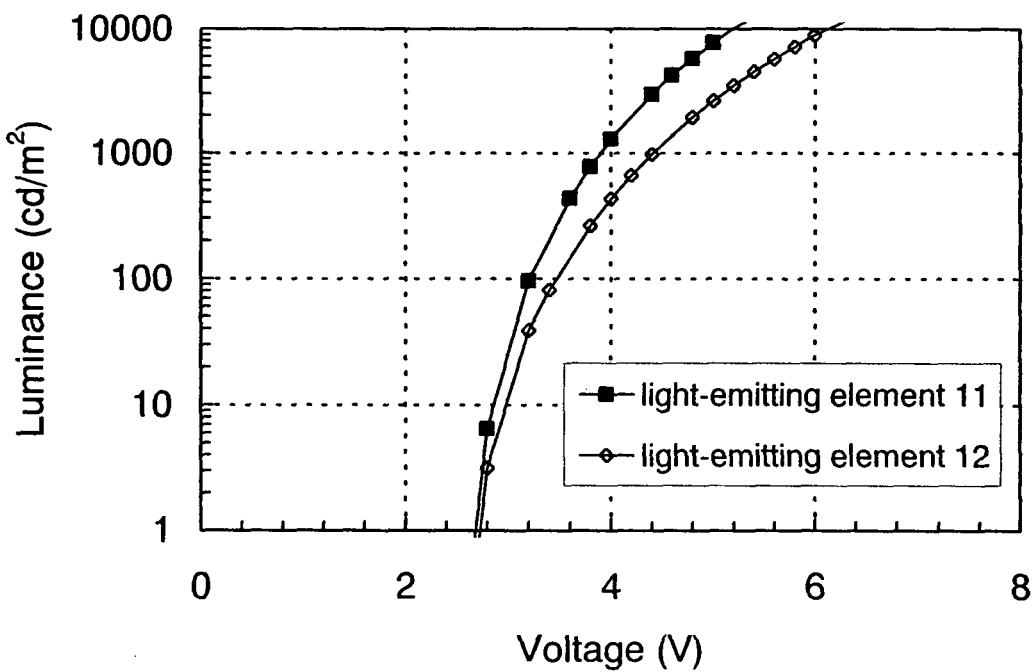
Figure 17:
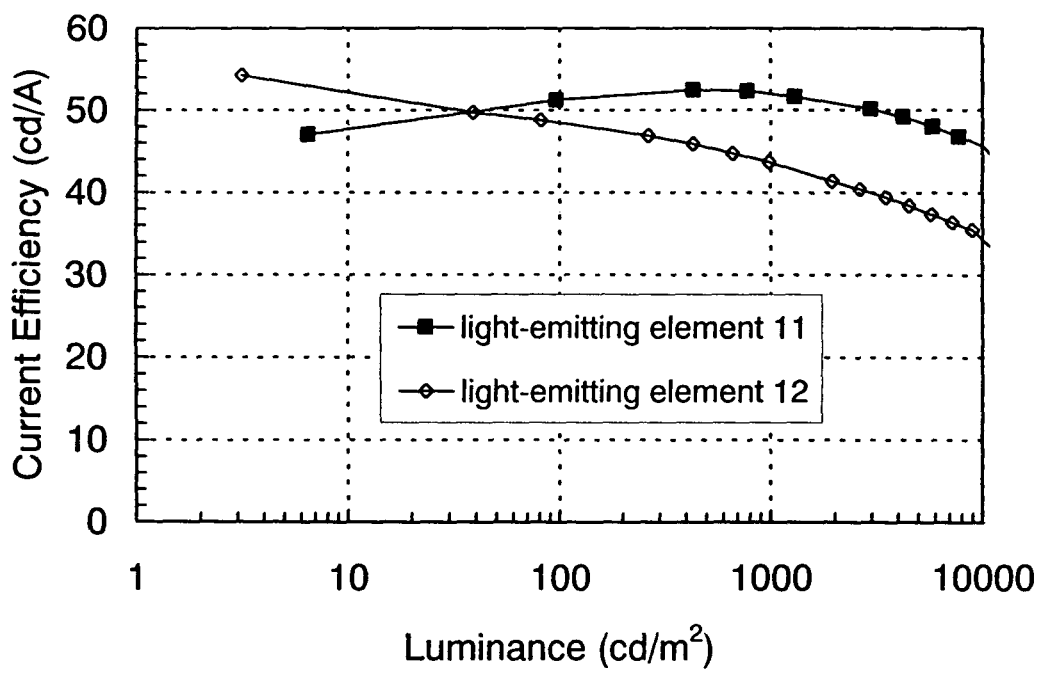
FIG. 17 is a view showing operation characteristics of light-emitting elements manufactured in Example 7.

FIG. 16A shows current density-luminance characteristics of the light-emitting element 11 of the present invention and the comparative light-emitting element 12, and FIG. 16B shows voltage-luminance characteristics thereof. FIG. 17 shows luminance-current efficiency characteristics of these light-emitting elements. Current efficiency at 3000 cd/m² was 50.1 cd/A in the light-emitting-element 11 of the present invention, and 40.0 cd/A in the comparative light-emitting element 12. CIE chromaticity coordinates of each light-emitting element at 3000 cd/m² were (x, y)=(0.33, 0.65) in the light-emitting element 11 of the present invention and (x, y)=(0.33, 0.64) in the comparative light-emitting element 12. In the light-emitting element 11 of the present invention and the comparative light-emitting element 12, emission of green light from Ir(ppy)₂(acac) that was a guest material was obtained.

The results were summarized in Table 5 below. As shown in Table 5, when the light-emitting element 11 of the present invention is compared with the comparative light-emitting element 12, it is found that luminous efficiency of the comparative light-emitting element 12 is lowered as compared with the light-emitting element 11 of the present invention.

TABLE 5

| | Element configuration | | | Current Efficiency [cd/A] @ 3000 cd/m² |
|---|---|---|---|---|
| | Hole transporting layer | Light-emitting layer (host + guest) | | Electron transporting layer | |
| Light-emitting element 11 | NPB | First light-emitting layer YGASF + Ir(ppy)₂(acac) | Second light-emitting layer Zn(BIZ)₂ + Ir(ppy)₂(acac) | BAlq | 50.1 |
| Light-emitting element 12 | NPB | Zn(BIZ)₂ + Ir(ppy)₂(acac) | | BAlq | 40.0 |

As described above, it was found that high luminous efficiency can be obtained by manufacture of the light-emitting element of the present invention. In addition, it was found that a stable compound, such as NPB or Alq₃, having lower triplet excitation energy than Ir(ppy)₂(acac) that is a phosphorescent compound can be used for the hole transporting layer and the electron transporting layer. Therefore, by implementation of the present invention, a light-emitting element with high luminous efficiency and long life can be obtained. Further,

EXAMPLE 7

This example explains a material used in another example.
<<A synthesis Example of YGAO11>>

Hereinafter, a synthesis method of 2-(4-{N-[4-(carbazol-9-yl)phenyl]-N-phenylamino}phenyl)-5-phenyl-1,3,4-oxadiazole (abbreviation: YGAO11) represented by the structural formula (401) will be explained.

(401)

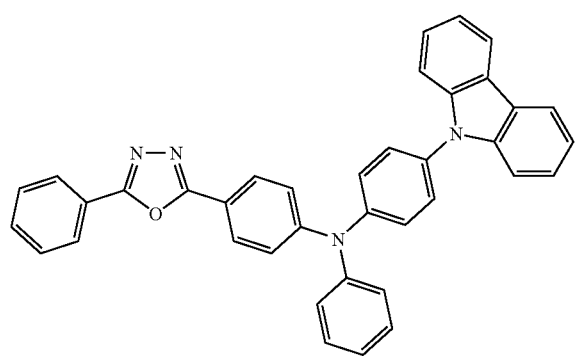

[Step 1]

Synthesis of 2-(4-bromophenyl)-5-phenyl-1,3,4-oxadiazole (abbreviation: O11 Br) will be explained. In Step 1, O11 Br was synthesized according to (i) to (iii) shown below.

(i) Synthesis of 4-bromobenzohydrazide

First, 3.0 g (13.9 mmol) of methyl-4-bromobenzoate was put in a 100-mL three-neck flask, 10 mL of ethanol was added thereto, and the mixture was stirred. Thereafter, 4.0 mL of hydrazine monohydrate was added thereto, and the mixture was heated and stirred at 78° C. for 5 hours. The obtained solid was washed with water and collected by suction filtration; thus, 2.0 g of a white solid of 4-bromobenzohydrazide that was an object was obtained in the yield of 67%.

(ii) Synthesis of 1-benzoyl-2-(4-bromobenzoyl)hydrazine

Subsequently, 2.0 g (13.9 mmol) of the 4-bromobenzohydrazide obtained in (i) above was put in a 300-mL three-neck flask, 7 mL of N-methyl-2-pyrrolidone (abbreviation: NMP) was added thereto, and the mixture was stirred. Thereafter, a mixture of 2.5 mL of N-methyl-2-pyrrolidone and 2.5 mL (21.5 mmol) of benzoyl chloride was dripped through a 50-mL dropping funnel, and the mixture was stirred at 80° C. for 3 hours. The obtained solid was washed with water and a sodium carbonate aqueous solution in this order and collected by suction filtration. Then, the solid was recrystallized with acetone; thus, 3.6 g of a white solid of 1-benzoyl-2-(4-bromobenzoyl)hydrazine that was an object was obtained in the yield of 80%.

(iii) Synthesis of O11 Br

Further, 15 g (47 mmol) of the 1-benzoyl-2-(4-bromobenzoyl)hydrazine obtained by the method shown in (ii) above was put in a 200-mL three-neck flask, 100 mL of phosphoryl chloride was added thereto, and the mixture was heated and stirred at 100° C. for 5 hours. After the reaction, the solid obtained by completely distilling off phosphoryl chloride was washed with water and a sodium carbonate aqueous solution in this order and collected by suction filtration. Then, the solid was recrystallized with methanol; thus, 13 g of a white solid of O11 Br that was an object of Step 1 was obtained in the yield of 89%. A synthesis scheme of Step 1 described above is shown in the following scheme (F-1).

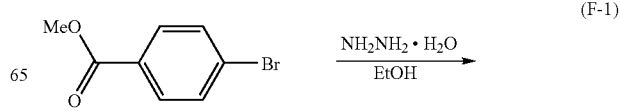

(F-1)

-continued

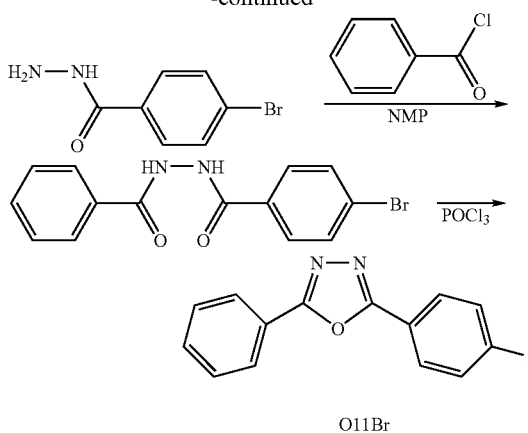

O11Br

[Step 2]

A synthesis method of 9-[4-(N-phenylamino)phenyl]carbazole (abbreviation: YGA) will be explained.

(i) Synthesis of N-(4-bromophenyl)carbazole

A synthesis scheme (C-1) of N-(4-bromophenyl)carbazole is shown below.

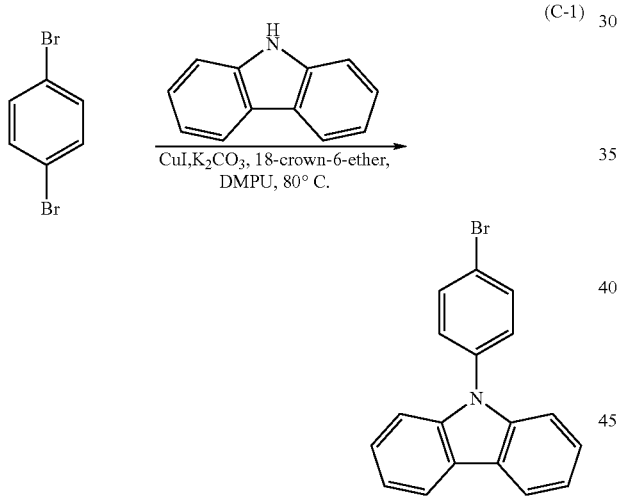

(C-1)

First, a synthesis method of N-(4-bromophenyl)carbazole will be explained. In a 300-ml three-neck flask, 56.3 g (0.24 mol) of 1,4-dibromobenzene, 31.3 g (0.18 mol) of carbazole, 4.6 g (0.024 mol) of copper iodide, 66.3 g (0.48 mol) of potassium carbonate, and 2.1 g (0.008 mol) of 18-crown-6-ether were put, and nitrogen substitution was carried out. Then, 8 mL of 1,3-dimethyl-3,4,5,6-tetrahydro-2(1H)-pyrimidinone (abbreviation: DMPU) was added and the mixture was stirred at 180° C. for 6 hours. After the reaction mixture was cooled to room temperature, the sediment was removed by suction filtration. The filtrate was washed with diluted hydrochloric acid, a saturated sodium hydrogen carbonate aqueous solution, and saturated saline in this order and then dried with magnesium sulfate. After the drying, the reaction mixture was naturally filtered and the filtrate was concentrated, and then the obtained oil-like substance was purified by silica gel column chromatography (hexane:ethyl acetate=9:1), and a solid was obtained. The obtained solid was recrystallized with chloroform and hexane; thus, 20.7 g of a light brown plate-like crystal of N-(4-bromophenyl)carbazole that was an object was obtained in the yield of 35%. It was confirmed by a nuclear magnetic resonance method (NMR) that this compound was N-(4-bromophenyl)carbazole.

$^1$H NMR data of the compound obtained is shown below.

$^1$H NMR (300 MHz, CDCl$_3$); δ=8.14 (d, J=7.8 Hz, 2H), δ=7.73 (d, J=8.7 Hz, 2H), δ=7.46 (d, J=8.4 Hz, 2H), δ=7.42-7.26 (m, 6H)

(ii) Synthesis of 9-[4-(N-phenylamino)phenyl]carbazole (abbreviation: YGA)

A synthesis scheme (C-2) of YGA is shown below.

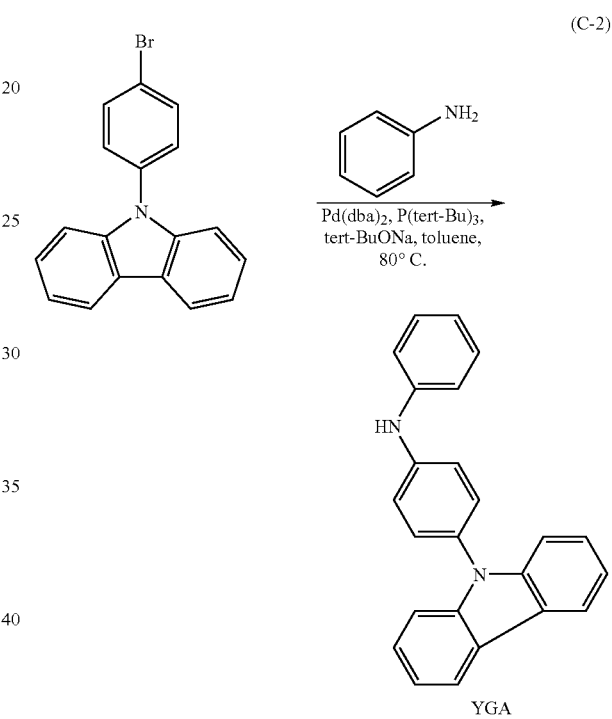

(C-2)

In a 200-ml three-neck flask, 5.4 g (17.0 mmol) of the N-(4-bromophenyl)carbazole obtained in (i) above, 1.8 mL (20.0 mmol) of aniline, 100 mg (0.17 mmol) of bis(dibenzylideneacetone)palladium(0), and 3.9 g (40 mmol) of sodium-tert-butoxide were put and nitrogen substitution was carried out. Then, 0.1 mL of tri-tert-butylphosphine (10 wt % hexane solution) and 50 mL of toluene were added thereto and the mixture was stirred at 80° C. for 6 hours. After the reaction mixture was filtered through Florisil, Celite, and alumina, the filtrate was washed with water and saturated saline and then dried with magnesium sulfate. The reaction mixture was naturally filtered and the filtrate was concentrated, and then the obtained oil-like substance was purified by silica gel column chromatography (hexane:ethyl acetate=9:1); thus, 4.1 g of 9-[4-(N-phenylamino)phenyl]carbazole (abbreviation: YGA) that was an object was obtained in the yield of 73%. It was confirmed by a nuclear magnetic resonance method (NMR) that this compound was 9-[4-(N-phenylamino)phenyl]carbazole (abbreviation: YGA).

$^1$H NMR data of the compound obtained is shown below.

$^1$H NMR (300 MHz, DMSO-d$_6$); δ=8.47 (s, 1H), δ=8.22 (d, J=7.8 Hz, 2H), δ=7.44-7.16 (m, 14H), δ=6.92-6.87 (m, 1H)

[Step 3]

Synthesis of 2-(4-{N-[4-(carbazol-9-yl)phenyl]-N-phenylamino}phenyl)-5-phenyl-1,3,4-oxadiazole (abbreviation: YGAO11) will be explained.

3.0 g (10.0 mmol) of O11Br obtained in Step 1, 3.4 g (10.0 mmol) of the YGA obtained in Step 2, and 1.9 g (19.9 mmol) of sodiumtert-butoxide were put in a 100-mL three-neck flask, and nitrogen substitution was carried out. Then, 45 mL of toluene, 0.3 mL of a 10% hexane solution of tri(tert-butyl)phosphine, and 0.3 g (0.6 mmol) of bis(dibenzylideneacetone)palladium(0) were added thereto, and the mixture was heated and stirred at 120° C. for 5 hours. After the reaction, the mixture was filtered through Celite, and the filtrate was washed with water and dried with magnesium sulfate. After the drying, the solution was filtrated, and the filtrate was concentrated. An obtained solid was dissolved in toluene and purified by silica gel column chromatography. Purification by column chromatography was performed by using toluene as a developing solvent and then using a mixed solvent of toluene:ethyl acetate=1:1 as a developing solvent. The purified solid was recrystallized with chloroform and hexane; thus, 4.7 g of a light-yellow solid of 2-(4-{N-[4-(carbazol-9-yl)phenyl]-N-phenylamino}phenyl)-5-phenyl-1,3,4-oxadiazole (abbreviation: YGAO11) that was an object was obtained in the yield of 85%. The synthesis scheme of Step 3 described above is shown in the following scheme (F-2).

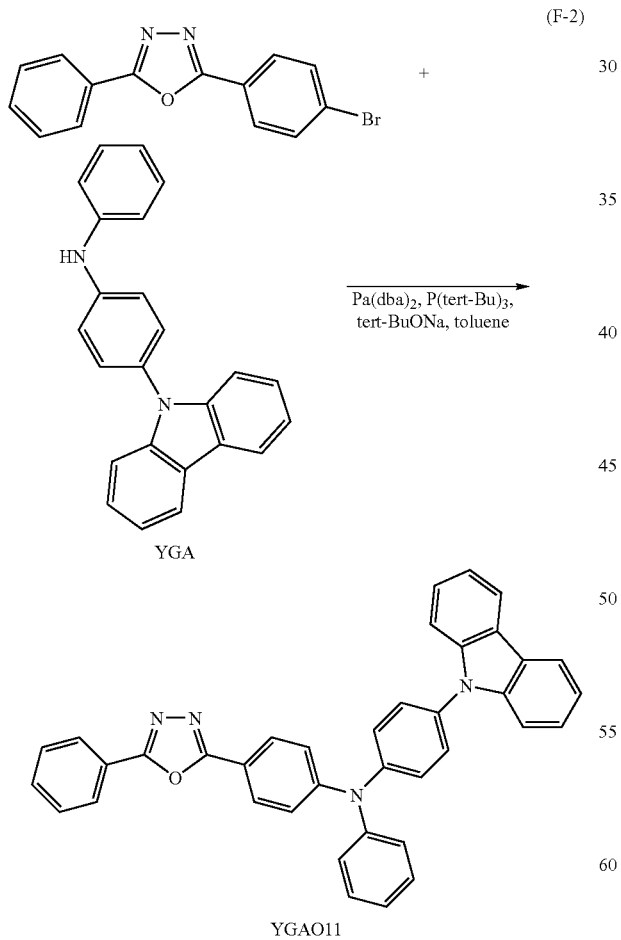

The following shows a result of analyzing the obtained YGAO11 by nuclear magnetic resonance spectroscopy ($^1$H NMR).

$^1$H NMR (CDCl$_3$, 300 MHz): δ=7.14-7.53 (m, 19H), δ=8.03 (d, J=8.7, 2H), and δ=8.11-8.15 (m, 4H)

<<A synthesis example of YGAF>>

A synthesis method of N-[4-(carbazol-9-yl)phenyl]-N-phenyl-9,9-dimethylfluorenyl-2-amine (abbreviation: YGAF) represented by the structural formula (402) will be explained.

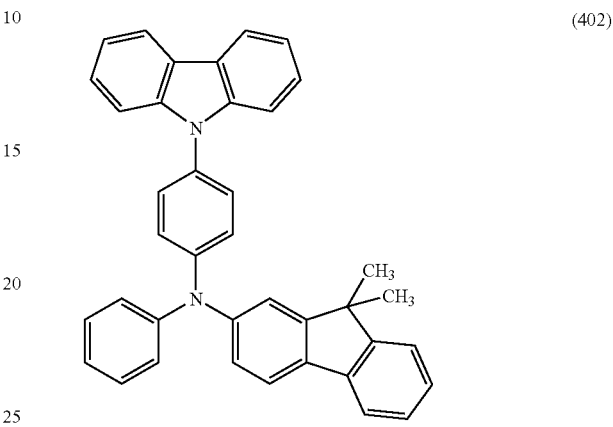

[Step 1]

A synthesis method of N-[4-(carbazol-9-yl)phenyl]-N-phenyl-9,9-dimethylfluorenyl-2-amine (abbreviation: YGAF) represented by the structural formula (402) will be explained. The synthesis scheme is shown in the following scheme (D-1).

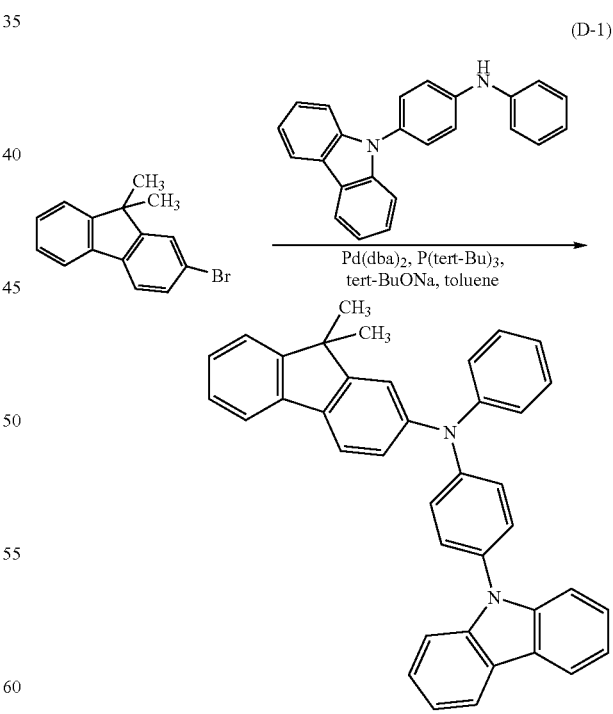

2.9 g (10 mmol) of 2-bromo-9,9-dimethylfluorene, 3.34 g (10 mmol) of 49-[4-(N-phenylamino)phenyl]carbazole (abbreviation: YGA), 115 mg (0.2 mmol) of bis(dibenzylideneacetone)palladium(0), and 3.0 g (31.2 mmol) of t-butoxysodium were put in a 300-mL three-neck flask, and nitrogen substitution was carried out. 100 mL of toluene and 0.2 mL of tri(t-butyl)phosphine (10 wt % hexane solution) were added thereto, and the mixture was stirred at 80° C. for 5 hours. After the reaction, the reaction mixture was filtered through Celite, Florisil, and alumina, and the filtrate was washed with water and an aqueous layer was subjected to extraction with toluene. The extracted solution was washed with saturated saline together with an organic layer, and dried with magnesium sulfate. Then, the reaction mixture was filtered naturally, the filtrate was concentrated, and a solid was obtained. The obtained solid was purified by silica gel column chromatography (hexane:toluene=7:3); thus, 3.6 g of a white solid that was an object was obtained in the yield of 64%. It was confirmed by a nuclear magnetic resonance method (NMR) that this compound was N-[4-(carbazol-9-yl)phenyl]-N-phenyl-9,9-dimethylfluorenyl-2-amine (abbreviation: YGAF).

$^1$H NMR data of the compound is shown below.

$^1$H NMR (300 MHz, DMSO-$d_6$); δ=1.40 (s, 6H), 7.09-7.53 (m, 20H), 7.75-7.77 (m, 1H), 7.81 (d, J=8.4 Hz, 1H), 8.23 (d, J=7.5 Hz, 2H)

<<A Synthesis Example of YGASF>>

A synthesis method of 2-{N-[4-(N-carbazolyl)phenyl]N-phenylamino}-spiro-9,9'-bifluorene (abbreviation: YGASF) represented by the structural formula (403) will be explained.

(403)

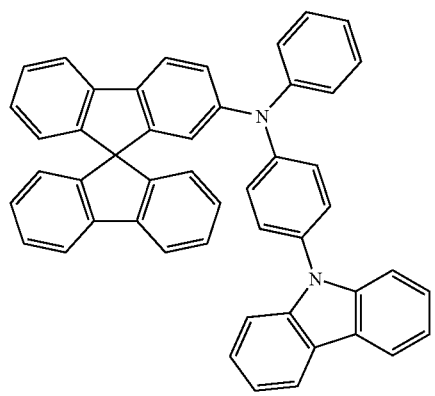

YGASF can be synthesized by conducting a coupling reaction of 2-bromo-spiro-9,9'-bifluorene represented by the following formula (404) and 9-[4-(N-phenylamino)phenyl]carbazole (abbreviation: YGA) represented by the following formula (405), using a metal catalyst.

(404)

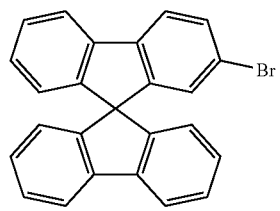

(405)

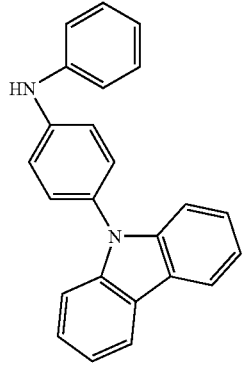

[Step 1]

A synthesis method of 2-bromo-spiro-9,9'-bifluorene will be explained.

1.26 g (0.052 mol) of magnesium was put in a 100-mL three-neck flask to which a dropping funnel and a Dimroth condenser were connected, and the flask was evacuated. The magnesium was activated by heating and stirring for 30 minutes. After cooling to room temperature, the flask was placed under a nitrogen gas flow. 5 mL of diethyl ether and several drips of dibromoethane were added thereto, and 11.65 g (0.050 mol) of 2-bromobiphenyl dissolved in 15 mL of diethyl ether was slowly dripped from the dropping funnel into the mixture. After the dripping was finished, the mixture was refluxed for 3 hours and made into a Grignard reagent. 11.7 g (0.045 mol) of 2-bromo-9-fluorenone and 40 mL of diethyl ether were put in a 200-mL three-neck flask to which a dropping funnel and a Dimroth condenser were connected. To this reaction solution, the synthesized Grignard reagent was slowly dripped from the dropping funnel. After the dripping was finished, the mixture was refluxed for 2 hours, and then stirred at room temperature for about 12 hours. After the reaction was finished, the solution was washed twice with a saturated ammonia chloride solution. An aqueous layer was extracted twice with ethyl acetate and was washed with saturated saline together with an organic layer. After drying with magnesium sulfate, suction filtration and concentration were conducted; thus, 18.76 g of a solid of 9-(biphenyl-2-yl)-2-bromo-9-fluorenol was obtained in the yield of 90%.

A synthesis scheme (E-1) of 9-(biphenyl-2-yl)-2-bromo-9-fluorenol is shown below.

(E-1)

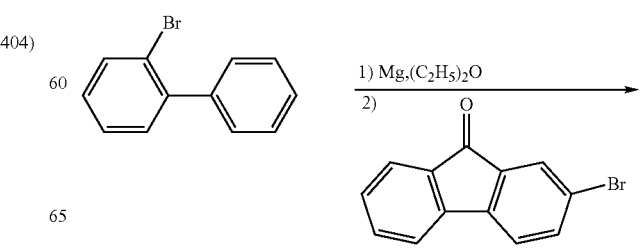

-continued

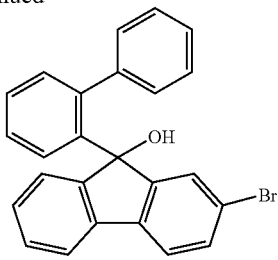

In a 200-mL three-neck flask, 18.76 g (0.045 mol) of the synthesized 9-(biphenyl-2-yl)-2-bromo-9-fluorenol and 100 mL of glacial acetic acid were put, several drips of concentrated hydrochloric acid were added thereto, and the mixture was refluxed for 2 hours. After the reaction was finished, a precipitate was collected by suction filtration, and the precipitate was filtered and washed with a saturated sodium hydrogen carbonate solution and water. The obtained brown solid was recrystallized with ethanol; thus, 10.24 g of a light-brown powdered solid was obtained in the yield of 57%. It was confirmed by a nuclear magnetic resonance method (NMR) that this light-brown powdered solid was 2-bromo-spiro-9,9'-fluorene.

$^1$H NMR of the compound obtained is shown below.

$^1$H NMR (300 MHz, CDCl$_3$) δppm: 7.86-7.79 (m, 3H), 7.70 (d, 1H, J=8.4 Hz), 7.50-7.47 (m, 1H), 7.41-7.34 (m, 3H), 7.12 (t, 3H, J=7.7 Hz), 6.85 (d, 1H, J=2.1 Hz), 6.74-6.76 (m, 3H)

A synthesis scheme (E-2) of 2-bromo-spiro-9,9'-bifluorene is shown below.

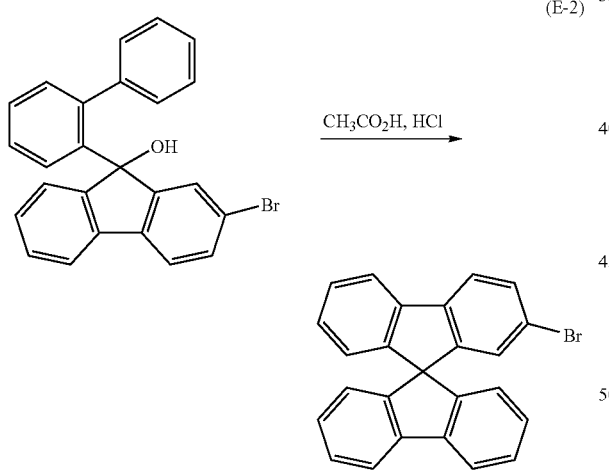

(E-2)

[Step 2]

A synthesis method of YGASF will be explained.

2.0 g (5.1 mmol) of 2-bromo-spiro-9,9'-bifluorene, 1.7 mg (5.1 mmol) of 9-[4-(N-phenylamino)phenyl]carbazole (abbreviation: YGA), 30.4 mg (0.05 mmol) of bis(dibenzylideneacetone)palladium(0), and 2.0 g (21 mmol) of t-butoxysodium were put in a 100-mL three-neck flask, and nitrogen substitution was carried out. 30 mL of toluene was added thereto, and the mixture was degassed at reduced pressure. 0.1 mL of tri(t-butyl)phosphine (10 wt % hexane solution) was added thereto, and the mixture was stirred at 80° C. for 6 hours. After the reaction, the mixture was filtered through Celite. The filtrate was washed three times with water and once with saturated saline, and dried with magnesium sulfate. The reaction mixture was filtered naturally, the filtrate was concentrated, and an oil-like substance was obtained. This oil-like substance was purified by silica gel column chromatography (hexane:toluene=7:3). Then, recrystallization by chloroform and hexane was carried out; thus, 2.9 g of a white powdered solid was obtained in the yield of 88%. It was confirmed by a nuclear magnetic resonance method (NMR) that this white powdered solid was YGASF.

$^1$H NMR of the compound obtained is shown below.

$^1$H NMR (300 MHz, DMSO-d$_6$); δ=8.19 (d, J=7.80 Hz, 2H), 7.97-7.91 (m, 4H), 7.43-7.01 (m, 22H), 6.71 (d, J=7.80 Hz, 2H), 6.71 (d, J=7.80 Hz, 2H), 6.58 (d, J=6.9 Hz, 1H), 6.32 (d, J=2.10 Hz, 1H)

Next, a synthesis scheme (E-3) of YGASF is shown below.

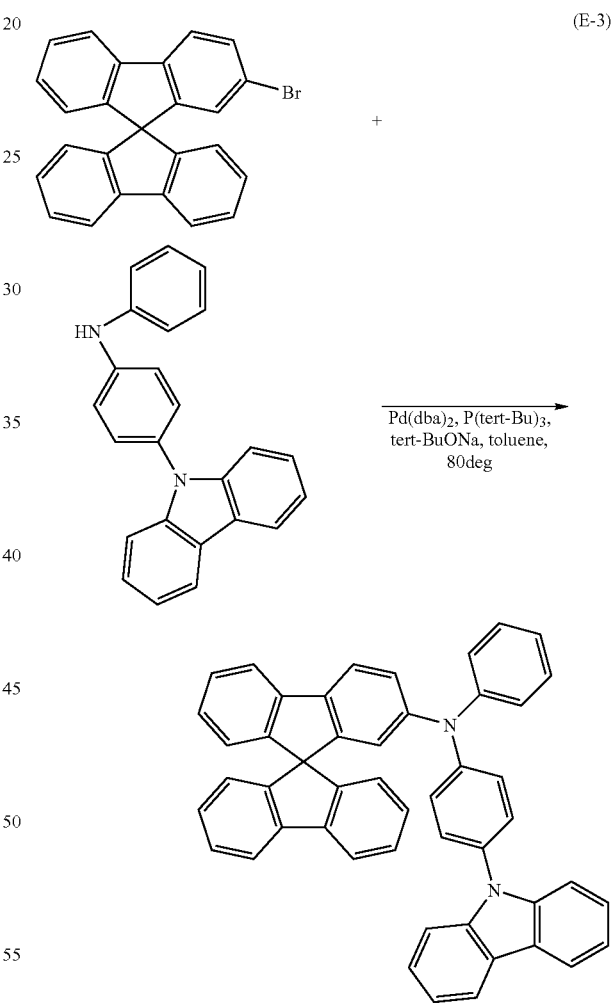

(E-3)

Sublimation purification was conducted for 24 hours on 2.50 g of the obtained YGASF at a pressure of 6.7 Pa and a temperature of 300° C.; thus, 2.4 g was collected in the yield of 96%.

This application is based on Japanese Patent Application serial No. 2006-077896 filed in Japan Patent Office on Mar. 21, 2006, the entire contents of which are hereby incorporated by reference.

What is claimed is:

1. A light-emitting element comprising:
a first light-emitting layer and a second light-emitting layer being in contact with each other between a first electrode and a second electrode, and
a hole transporting layer between the first electrode and the first light-emitting layer, and
an electron transporting layer between the second electrode and the second light-emitting layer,
wherein the first light-emitting layer comprises a compound represented by Formula (401) and a phosphorescent compound, and the second light-emitting layer comprises an electron transporting host material and the phosphorescent compound

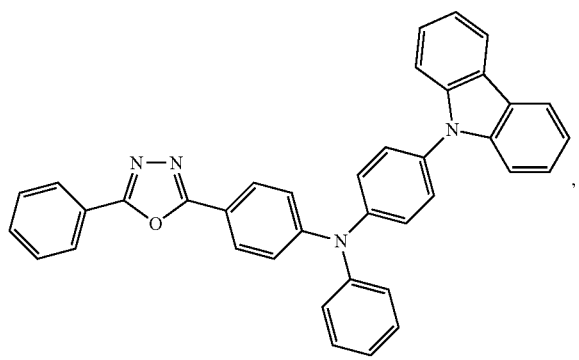

(401)

wherein a material of the hole transporting layer has triplet excitation energy lower than that of the phosphorescent compound, and
wherein at least one of the first light-emitting layer and the second light-emitting layer emits green light or yellowish green light.

2. The light-emitting element according to claim 1, wherein the phosphorescent compound is a guest material.

3. An electronic device having the light-emitting element according to claim 1, wherein the electronic device is one selected from the group consisting of a computer, telephone, television set, a navigation system, and a lighting apparatus.

4. A light-emitting element comprising:
a first light-emitting layer and a second light-emitting layer being in contact with each other between a first electrode and a second electrode,
a hole transporting layer between the first electrode and the first light-emitting layer, the hole transporting layer being in contact with the first light-emitting layer, and
an electron transporting layer between the second electrode and the second light-emitting layer,
wherein the first light-emitting layer comprises a compound represented by Formula (401) and a phosphorescent compound, and the second light-emitting layer comprises an electron transporting host material and the phosphorescent compound

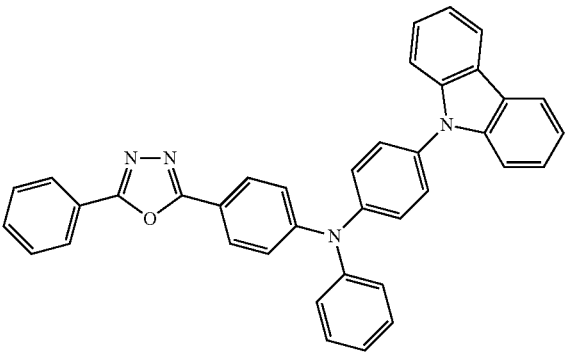

(401)

wherein a material of the hole transporting layer has triplet excitation energy lower than that of the phosphorescent compound, and
wherein at least one of the first light-emitting layer and the second light-emitting layer-emits green light or yellowish green light.

5. The light-emitting element according to claim 4, wherein the phosphorescent compound is a guest material.

6. An electronic device having the light-emitting element according to claim 4, wherein the electronic device is one selected from the group consisting of a computer, telephone, television set, a navigation system, and a lighting apparatus.

7. The light-emitting element according to claim 4, further comprising a hole injecting layer between the first electrode and the hole transporting layer, wherein the hole injecting layer comprises an organic compound and an inorganic compound.

8. The light-emitting element according to claim 1, wherein the hole transporting layer comprises a compound selected from an aromatic amine compound and an anthracene derivative.

9. The light-emitting element according to claim 7, wherein the organic compound is selected from an aromatic amine compound and an anthracene derivative.

10. The light-emitting element according to claim 7, wherein the inorganic compound is transition metal oxide.

11. The light-emitting element according to claim 7, wherein the inorganic compound is selected from molybdenum oxide, vanadium oxide and rhenium oxide.

12. The light-emitting element according to claim 1, wherein the phosphorescent compound is an organic metal complex.

13. The light-emitting element according to claim 4, wherein the hole transporting layer comprises a compound selected from an aromatic amine compound and an anthracene derivative.

14. The light-emitting element according to claim 4, wherein the phosphorescent compound is an organic metal complex.

15. The light-emitting element according to claim 1, wherein the electron transporting host material is a heteroaromatic compound.

16. The light-emitting element according to claim 4, wherein the electron transporting host material is a heteroaromatic compound.

* * * * *